US010293704B2

(12) United States Patent
Aronov

(10) Patent No.: US 10,293,704 B2
(45) Date of Patent: *May 21, 2019

(54) ELECTRIC VEHICLES WITH ADAPTIVE FAST-CHARGING, UTILIZING SUPERCAPACITOR-EMULATING BATTERIES

(71) Applicant: StoreDot Ltd., Herzeliya (IL)

(72) Inventor: Daniel Aronov, Netanya (IL)

(73) Assignee: StoreDot Ltd., Herzeliya (IL)

( * ) Notice: Subject to any disclaimer, the term of this patent is extended or adjusted under 35 U.S.C. 154(b) by 0 days.

This patent is subject to a terminal disclaimer.

(21) Appl. No.: 15/783,586

(22) Filed: Oct. 13, 2017

(65) Prior Publication Data
US 2018/0050602 A1 Feb. 22, 2018

Related U.S. Application Data

(63) Continuation-in-part of application No. 15/287,292, filed on Oct. 6, 2016, now abandoned, which is a
(Continued)

(51) Int. Cl.
*H01M 2/00* (2006.01)
*H01M 4/13* (2010.01)
(Continued)

(52) U.S. Cl.
CPC ......... *B60L 11/1862* (2013.01); *B60L 11/005* (2013.01); *B60L 11/185* (2013.01);
(Continued)

(58) Field of Classification Search
None
See application file for complete search history.

(56) References Cited

U.S. PATENT DOCUMENTS 3,778,254 A 12/1973 Cole et al.
6,051,340 A 4/2000 Kawakami et al.
(Continued)

FOREIGN PATENT DOCUMENTS

CA 2161076 4/1996
CA 2258026 12/1997
(Continued)

OTHER PUBLICATIONS

U.S. Appl. No. 62/371,874, filed Aug. 8, 2016, Burshtain.
(Continued)

*Primary Examiner* — Cynthia H Kelly
*Assistant Examiner* — Julian Anthony
(74) *Attorney, Agent, or Firm* — Pearl Cohen Zedek Latzer Baratz LLP

(57) ABSTRACT

Electric vehicles (EVs), power trains and control units and methods are provided. Power trains comprise a main fast-charging lithium ion battery (FC), configured to deliver power to the electric vehicle, a supercapacitor-emulating fast-charging lithium ion battery (SCeFC), configured to receive power and deliver power to the FC and/or to the EV, and a control unit. Both the FC and the SCeFC have anodes based on the same anode active material, and the SCeFC is configured to operate at high rates within a limited operation range of state of charge (SoC), maintained by the control unit, which is further configured to manage the FC and the SCeFC with respect to power delivery to and from the EV, respectively, and manage power delivery from the SCeFC to the FC according to specified criteria that minimize a depth of discharge and/or a number of cycles of the FC.

19 Claims, 18 Drawing Sheets

Related U.S. Application Data continuation-in-part of application No. 14/675,771, filed on Apr. 1, 2015, now abandoned, application No. 15/783,586, which is a continuation-in-part of application No. 15/582,066, filed on Apr. 28, 2017, now Pat. No. 10,110,036, which is a continuation-in-part of application No. 15/678,143, filed on Aug. 16, 2017, which is a continuation-in-part of application No. 15/287,292, filed on Oct. 6, 2016, now abandoned, and a continuation-in-part of application No. 14/675,771, filed on Apr. 1, 2015, now abandoned.

(60) Provisional application No. 62/238,515, filed on Oct. 7, 2015, provisional application No. 61/976,551, filed on Apr. 8, 2014, provisional application No. 62/434,432, filed on Dec. 15, 2016.

(51) Int. Cl.
| | | |
|---|---|---|
| *H01M 4/58* | (2010.01) | |
| *H01M 10/48* | (2006.01) | |
| *B60L 11/18* | (2006.01) | |
| *B60L 11/00* | (2006.01) | |
| *G01R 31/36* | (2019.01) | |
| *H02J 7/00* | (2006.01) | |

(52) U.S. Cl.
CPC ...... *B60L 11/1868* (2013.01); *G01R 31/3606* (2013.01); *H02J 7/007* (2013.01); *H02J 7/0022* (2013.01); *H02J 7/0054* (2013.01); *B60L 2240/547* (2013.01); *B60L 2240/549* (2013.01); *B60W 2510/244* (2013.01); *H02J 7/0036* (2013.01); *H02J 2007/005* (2013.01); *H02J 2007/0049* (2013.01)

(56) References Cited

U.S. PATENT DOCUMENTS

| | | | |
|---|---|---|---|
| 6,492,061 | B1 | 12/2002 | Gauthier et al. |
| 6,541,156 | B1 | 4/2003 | Fuse et al. |
| 6,558,438 | B1 | 5/2003 | Satoh et al. |
| 6,599,662 | B1 | 7/2003 | Chiang et al. |
| 7,192,673 | B1 | 3/2007 | Ikeda et al. |
| 7,656,120 | B2 | 2/2010 | Neu et al. |
| 7,906,238 | B2 | 3/2011 | Le |
| 7,956,576 | B2 | 6/2011 | Neu et al. |
| 8,021,791 | B1 | 9/2011 | Plichta et al. |
| 8,945,774 | B2 | 2/2015 | Coowar et al. |
| 8,951,673 | B2 | 2/2015 | Wessells et al. |
| 9,406,927 | B1 | 8/2016 | Burshtain et al. |
| 9,472,804 | B2 | 10/2016 | Burshtain et al. |
| 9,583,761 | B2 | 2/2017 | Burshtain et al. |
| 9,728,776 | B2 | 8/2017 | Burshtain et al. |
| 2001/0017531 | A1 | 8/2001 | Sakakibara et al. |
| 2002/0122980 | A1 | 9/2002 | Fleischer et al. |
| 2002/0146623 | A1 | 10/2002 | Suzuki et al. |
| 2003/0039889 | A1 | 2/2003 | Park et al. |
| 2004/0033360 | A1 | 2/2004 | Armand et al. |
| 2004/0219428 | A1 | 11/2004 | Nagayama |
| 2005/0019659 | A1 | 1/2005 | Shiozaki et al. |
| 2005/0093512 | A1 | 5/2005 | Mader et al. |
| 2007/0003837 | A1 | 1/2007 | Nishimura et al. |
| 2007/0281216 | A1 | 12/2007 | Petrat et al. |
| 2007/0284159 | A1* | 12/2007 | Takami ............... B60K 6/46 180/65.1 |
| 2008/0093143 | A1 | 4/2008 | Harrison |
| 2008/0248386 | A1 | 10/2008 | Obrovac et al. |
| 2009/0111020 | A1 | 4/2009 | Yamaguchi et al. |
| 2009/0179181 | A1 | 7/2009 | Zhang et al. |
| 2009/0317637 | A1 | 12/2009 | Luhrs et al. |
| 2010/0134065 | A1 | 6/2010 | Iida |
| 2010/0134305 | A1 | 6/2010 | Lu et al. |
| 2010/0159331 | A1 | 6/2010 | Lee et al. |
| 2010/0190059 | A1 | 7/2010 | Graetz et al. |
| 2011/0257001 | A1 | 10/2011 | Negishi |
| 2011/0260689 | A1 | 10/2011 | Kano |
| 2012/0045696 | A1 | 2/2012 | Herle |
| 2012/0088155 | A1 | 4/2012 | Yushin et al. |
| 2012/0164531 | A1 | 6/2012 | Chen et al. |
| 2013/0040226 | A1 | 2/2013 | Yamauchi et al. |
| 2013/0059174 | A1 | 3/2013 | Zhamu |
| 2013/0224594 | A1 | 8/2013 | Yushin et al. |
| 2013/0229153 | A1 | 9/2013 | Sarkar et al. |
| 2013/0260285 | A1 | 10/2013 | Yamauchi et al. |
| 2013/0266875 | A1 | 10/2013 | Matsumoto et al. |
| 2014/0004426 | A1 | 1/2014 | Kerlau et al. |
| 2014/0113202 | A1 | 4/2014 | Sun et al. |
| 2014/0295267 | A1 | 10/2014 | Wang |
| 2015/0017515 | A1 | 1/2015 | Jeon et al. |
| 2015/0046110 | A1 | 2/2015 | Joe et al. |
| 2015/0221977 | A1 | 8/2015 | Hallac et al. |
| 2015/0367747 | A1 | 12/2015 | Decker et al. |
| 2016/0036045 | A1 | 2/2016 | Burshtain et al. |
| 2016/0064773 | A1 | 3/2016 | Choi et al. |
| 2016/0104882 | A1 | 4/2016 | Yushin et al. |
| 2016/0149220 | A1 | 5/2016 | Uhm et al. |
| 2016/0264124 | A1 | 9/2016 | Hotta |
| 2016/0372753 | A1 | 12/2016 | Fukasawa et al. |
| 2017/0012279 | A1 | 1/2017 | Burshtain et al. |
| 2017/0207451 | A1 | 7/2017 | Burshtain et al. |
| 2017/0294643 | A1 | 10/2017 | Burshtain et al. |
| 2017/0294644 | A1 | 10/2017 | Burshtain et al. |
| 2017/0294648 | A1 | 10/2017 | Burshtain et al. |
| 2017/0294649 | A1 | 10/2017 | Burshtain et al. |
| 2017/0294680 | A1 | 10/2017 | Burshtain et al. |
| 2017/0294687 | A1 | 10/2017 | Burshtain et al. |
| 2018/0108937 | A1 | 4/2018 | Drach et al. |
| 2018/0175634 | A1 | 6/2018 | Aronov |
| 2018/0212236 | A1 | 7/2018 | Jacob et al. |
| 2018/0212239 | A1 | 7/2018 | Jacob et al. |
| 2018/0212240 | A1 | 7/2018 | Jacob et al. |
| 2018/0212439 | A1 | 7/2018 | Aronov |
| 2018/0301757 | A1* | 10/2018 | Burshtain ............. H01M 4/366 |

FOREIGN PATENT DOCUMENTS

| | | |
|---|---|---|
| CN | 101734675 | 6/2010 |
| CN | 104577081 | 4/2015 |
| EP | 1999818 | 12/2008 |
| EP | 2889097 | 7/2015 |
| JP | 2002-056891 | 2/2002 |
| JP | 2006-216276 | 8/2006 |
| JP | 2007-323837 | 12/2007 |
| JP | 2008-053092 | 3/2008 |
| JP | 2012/131674 | 7/2012 |
| JP | 2014-002834 | 1/2014 |
| KR | 2012-121265 | 10/2012 |
| WO | WO 2013/040356 | 3/2013 |
| WO | WO 2014068036 | 5/2014 |
| WO | WO 2015/016563 | 7/2014 |
| WO | WO 2015/145521 | 10/2015 |
| WO | WO 2016/031082 | 3/2016 |

OTHER PUBLICATIONS

U.S. Appl. No. 62/401,635, filed Sep. 29, 2016, Kedem et al.
U.S. Appl. No. 62/421,290, filed Nov. 13, 2016, Burshtain.
U.S. Appl. No. 62/426,625, filed Nov. 28, 2016, Burshtain et al.
U.S. Appl. No. 62/319,341, filed Apr. 7, 2016, Burshtain.
U.S. Appl. No. 62/337,416, filed May 17, 2016, Burshtain.
U.S. Appl. No. 62/401,214, filed Sep. 22, 2016, Burshtain et al.
U.S. Appl. No. 15/414,655, filed Jan. 25, 2016, Jacob et al.
U.S. Appl. No. 62/427,856, filed Nov. 30, 2016, Burshtain et al.
U.S. Appl. No. 62/482,450, filed Apr. 6, 2017, Drach et al.
U.S. Appl. No. 15/678,143, filed Aug. 16, 2017, Aronov et al.
U.S. Appl. No. 15/447,784, filed Mar. 2, 2017, Burshtain et al.
U.S. Appl. No. 15/447,889, filed Mar. 2, 2017, Burshtain et al.
Chaudhuri et al. "Core/shell nanoparticles: classes, properties, synthesis mechanisms, characterization, and applications" Chemical Reviews, vol. 112, No. 4, pp. 2373-2433, 2012.

(56) References Cited

OTHER PUBLICATIONS

Wu et al. "Hydrogen Storage in Pillared Li-Dispersed Boron Carbide Nanotubes", J. Phys. Chem. C, 2008, vol. 112, No. 22, pp. 8458-8463.
Secrist "Compound Formation in the Systems Lithium-Carbon and Lithium-Boron", Journal of the American Ceramic Society, Oct. 1967, vol. 50, No. 10, pp. 520-523.
Suzuki et al. "Silicon nitride thin film electrode for lithium-ion batteries", Journal of Power Sources, 2013, vol. 231, pp. 186-189.
Konno et al. "Application of Si—C—O glass-like compounds as negative electrode materials for lithium hybrid capacitors", Journal of Power Sources, 2009, vol. 191, No. 2, pp. 623-627.
Hu et al. "Silicon/graphene based nanocomposite anode: large-scale production and stable high capacity for lithium ion batteries", Journal of Materials Chemistry A, 2014, vol. 2, No. 24, pp. 9118-9125.
Cui et al. "Carbon-Silicon Core-Shell Nanowires as High Capacity Electrode for Lithium Ion Batteries", Nano Letters, May 8, 2009, vol. 9, No. 9, pp. 3370-3374.
Kennedy et al. "High-Performance Germanium Nanowire-Based Lithium-Ion Battery Anodes Extending over 1000 Cycles Through in Situ Formation of a Continuous Porous Network", Nano Letters, 2014, vol. 14, pp. 716-723.
Hwang et al. "Mesoporous Ge/GeO2/Carbon Lithium-Ion Battery Anodes with High Capacity and High Reversibility", ACS Nano, Apr. 13, 2015, vol. 9, No. 5, pp. 5299-5309.
Balomenos et al. "Exergy Analysis of Metal Oxide Carbothemic Reduction under Vacuum—Sustainability prospects", International Journal of Thermodynamics, Jun. 4, 2012, vol. 15, No. 3, pp. 141-148.
Barton et al. "The Reduction of Germanium Dioxide With Graphite at High Temperatures", Journal of the Less-Common Metals, 1970, vol. 22, pp. 11-17.
Nitta et al. "High-Capacity Anode Materials for Lithium-Ion Batteries: Choice of Elements and Structures for Active Particles", Particle Systems Characterization, 2014, vol. 31, pp. 317-336.
Chung et al. "Electronically conductive phospho-olivines as lithium storage electrodes", nature materials, Oct. 22, 2002, vol. 1, pp. 123-128.
Kennedy et al. "Nanowire Heterostructures Comprising Germanium Stems and Silicon Branches as High-Capacity Li-Ion Anodes with Tunable Rate Capability", ACS Nano, Jun. 30, 2015, vol. 9, No. 7, pp. 7456-7465.
Kyotani et al. "Remarkable performance improvement of inexpensive ball-milled Si nanoparticles by carbon-coating for Li-ion batteries", Journal of Power Sources, Jul. 1, 2016, vol. 319, pp. 99-103.
Son et al. "Silicon carbide-free graphene growth on silicon for lithium-ion battery with high volumetric energy density", Nature Communications, Jun. 25, 2015, vol. 6, No. 7393, pp. 1-8.
Tow et al. "A Study of Highly Oriented Pyrolytic Graphite as a Model for the Graphite Anode in Li-Ion Batteries", Journal of The Electrochemical Society, 1999, vol. 146, No. 3, pp. 824-832.
Qi et al. "Threefold Increase in the Young's Modulus of Graphite Negative Electrode during Lithium Intercalation", Journal of The Electrochemical Society, 2010, vol. 157, No. 5, pp. A558-A566.
Qi et al. "Lithium Concentration Dependent Elastic Properties of Battery Electrode Materials from First Principles Calculations", Journal of The Electrochemical Society, 2014, vol. 161, No. 11, pp. F3010-F3018.
Wen et al. "Thermodynamic and Mass Transport Properties of "LiAl"", Solid-State Science and Technology, Dec. 1979, vol. 126, No. 12, pp. 2258-2266.
Wu et al. "Stable Li-ion battery anodes by in-situ polymerization of conducting hydrogel to conformally coat silicon nanoparticles", Nature Communications, Jun. 4, 2013, vol. 4, No. 1943, pp. 1-6.
Sun et al. "Silicon/Wolfram Carbide@Graphene composite: enhancing conductivity and structure stability in amorphous-silicon for high lithium storage performance", Electrochimica Acta, Jun. 25, 2016, vol. 191, pp. 462-472.

Cho et al. "Zero-Strain Intercalation Cathode for Rechargeable Li-Ion Cell", Angewandte Chemie, 2001, vol. 40, No. 18, pp. 3367-3369.
Ngo et al. "Mass-scalable synthesis of 3D porous germanium-carbon composite particles as an ultra-high rate anode for lithium ion batteries", Energy & Environmental Science, 2015, vol. 8, pp. 3577-3588.
Billaud et al. "Synthesis and electrical resistivity of lithium-pyrographite intercalation compounds (stages I, II and III)", Materials Research Bulletin, Jul. 1979, vol. 14, No. 7, pp. 857-864.
Guriparti et al. "Review on recent progress of nanostructured anode materials for Li-ion batteries", Journal of Power Sources, 2014, vol. 257, pp. 421-443.
Scott et al. "Ultrathin Coatings on Nano-LiCoO2 for Li-Ion Vehicular Applications", Nano Letters, 2011, vol. 11, pp. 414-418.
Chen et al. "Conductive Rigid Skeleton Supported Silicon as High-Performance Li-Ion Battery Anodes", Nano Letters, 2012, vol. 12, pp. 4124-4130.
Kim et al. "Electrochemical properties of carbon-coated Si/B composite anode for lithium ion batteries", Journal of Power Sources, 2009, vol. 189, pp. 108-113.
Wang et al. "Boron-doped carbon nanotube-supported Pt nanoparticles with improved CO tolerance for methanol electro-oxidation", Phys. Chem. Chem. Phys., 2012, vol. 14, pp. 13910-13913.
Wang et al. "The dimensionality of Sn anodes in Li-ion batteries", materialstoday, Dec. 2012, vol. 15, No. 12, pp. 544-552.
Bhandavat et al. "Improved Electrochemical Capacity of Precursor-Derived Si(B)CN-Carbon Nanotube Composite as Li-Ion Battery Anode", ACS Applied Materials & Interfaces, Oct. 2, 2012, vol. 4, pp. 5092-5097.
Bhandavat et al. "Synthesis, Characterization, and High Temperature Stability of Si(B) CN-Coated Carbon Nanotubes Using a Boron-Modified Poly(ureamethylvinyl)Silazane Chemistry", Journal of the American Ceramic Society, 2012, vol. 95, No. 5, pp. 1536-1543.
Nowotny et al. "Investigations in the three systems: Molybdenum-Silicon-boron, tungsten-Silicon-boron and in which System: VS12—TaSi2", MB. Chem., 1956, vol. 88, No. 2, pp. 179-182.
Kasavajjula et al. "Nano- and bulk-silicon-based insertion anodes for lithium-ion secondary cells", Journal of Power Sources, 2007, Vo. 163, pp. 1003-1039.
Yom et al. "Improved electrochemical behavior of Tungsten Coated Silicon Monoxide-Carbon composite anode in lithium ion battery",Abstract #1041, The Electrochemical Society 224th ECS Meeting, Oct. 27-Nov. 1, 2013.
Liu et al. "A pomegranate-inspired nanoscale design for large-volume-change lithium battery anodes", Nature Nanotechnology, Mar. 2014, vol. 9, pp. 187-192.
Tao et al. "Hollow core-shell structured Si/C nanocomposites as high-performance anode materials for lithium-ion batteries", Nanoscale, 2014, vol. 6, pp. 3138-3142.
Song et al. "Is Li4Ti5O12 a solid-electrolyte-interphase-free electrode material in Li-ion batteries? Reactivity between the Li4Ti5O12 electrode and electrolyte", Journal of Materials Chemistry A, 2014, vol. 2, pp. 631-636.
Byeon "Multifunctional metal-polymer nanoagglomerates from singlepass aerosol self-assembly", Scientific Reports, Aug. 10, 2016, pp. 1-8.
Dhawan et al. "Development of Highly Hydrophobic and Anticorrosive Conducting Polymer Composite Coating for Corrosion Protection in Marine Environment", American Journal of Polymer Science, 2015, vol. 5, No. 1A, pp. 7-17.
Skameche et al. "Electrodeposition, electrochemical and optical properties of poly(3-cylopropylmethylpyrrole), a new, hydrophobic, conducting polymer film", American Institute of Physics, 1996, vol. 354, No. 75, pp. 75-81.
Zhao et al. "Artificial Solid Electrolyte Interphase-Protected LixSi Nanoparticles: An Efficient and Stable Prelithiation Reagent for Lithium-Ion Batteries", Journal of the American Chemical Society, Jun. 19, 2015, vol. 137, No. 75, pp. 8372-8375.
Gay et al. "Performance Characteristics of Solid Lithium-Aluminium Alloy Electrodes", Journal of the Electrochemical Society, Nov. 1976, vol. 123, No. 11, pp. 1591-1596.

(56) References Cited

OTHER PUBLICATIONS

Li et al. "High-rate aluminium yolk-shell nanoparticle anode for Li-ion battery with long cycle life and ultrahigh capacity" Nature Communications, Aug. 5, 2015, pp. 1-7.
Maoz et al. "Site-Targeted Interfacial Solid-Phase Chemistry: Surface Functionalization of Organic Monolayers via Chemical Transformations Locally Induced at the Boundary between Two Solids", Angewandte Chemie, 2016, vol. 55, pp. 12366-12371.
Molino et al. "Hydrophobic conducting polymer films from post deposition thiol exposure", Synthetic Metals 162, 2012, pp. 1464-1470.
Jankovski et al. "New boron based salts for lithium-ion batteries using conjugated ligands", Physical Chemistry Chemical Physics, May 19, 2016, vol. 18, pp. 16274-16280.
Aurbach et al. "A short review of failure mechanisms of lithium metal and lithiated graphite anodes in liquid electrolyte solutions", Solid State Ionics, 2002, vol. 148, pp. 405-416.
He et al. "Effect of solid electrolyte interface (SEI) film on cyclic performance of Li4Ti5O12 anodes for Li ion batteries", Journal of Power Sources, 2013, vol. 239, pp. 269-276.
He et al. "Gassing in Li4Ti5O12-based batteries and its remedy", Scientific Reports, Dec. 3, 2012, vol. 2, No. 913, pp. 1-9.
Scharner et al. "Evidence of Two-Phase Formation upon Lithium Insertion into the Li1.33Ti1.67O4 Spinel", Journal of The Electrochemical Society, 1999, vol. 146, No. 3, pp. 857-861.
Doughty et al. "A General Discussion of Li Ion Battery Safety", The Electrochemical Society Interface, 2012, pp. 37-44.
E. McRae and J.F. Mareche "Stage dependence of the electrical resistivity of graphite intercalation compounds" Journal of Physics C: Solid State Physics, vol. 18, No. 8 , Apr. 5, 1983, pp. 1627-1640, Lab. de Chimie du Solide Miner., Nancy Univ., Vandoeuvre, France.
Takatoshi Kasukabe et al. "Beads-Milling of Waste Si Sawdust into High-Performance Nanoflakes for Lithium-Ion Batteries" Sci Rep. 2017; 7: 42734. Published online Feb. 20, 2017.
Yongxin An et al. "Effects of VC—LiBOB binary additives on SEI formation in ionic liquid—organic composite electrolyte" RSC Advances, 2012, 2, Received Nov. 6, 2011, Accepted Feb. 21, 2012, pp. 4097-4102.
Aaron M. Chockla "Tin-Seeded Silicon Nanowires for High Capacity Li-Ion Batteries" Department of Chemical Engineering, Texas Materials Institute, Center for Nano- and Molecular Science and Technology,The University of Texas at Austin, Austin, Texas 78712-1062, United States, pp. 3738-3745, Published: Sep. 11, 2012.
Yong-Mao Lin et al."High performance silicon nanoparticle anode in fluoroethylene carbonate-based electrolyte for Li-ion batteriesw" Chem. Commun., 2012, 48, Received Mar. 7, 2012, Accepted May 28, 2012, pp. 7268-7270.
Rosa Martel Danoary Tsirinomeny "Contribution to the Ultra-Fast Charging of Electric Vehicles: The Configurable Modular Multi-level Converter (CMMC)" Mots-clés de l'auteur: Ultra-fast; lithium-titanate; UFCEV; CMMC; Flex-EV. Mar. 4, 2016.

Xu et al. "Reversible Conversion of Conducting Polymer Films from Superhydrophobic to Superhydrophilic", Angewandte Chemie, 2005, vol. 44, pp. 6009-6012.
International Search Report and Written Opinion of PCT Application No. PCT/IL2017/050424, dated Jul. 13, 2017.
Office action of U.S. Appl. No. 15/480,888 dated Sep. 13, 2017.
Office action of U.S. Appl. No. 15/447,784 dated Oct. 19, 2017.
Office action of U.S. Appl. No. 15/582,066 dated Aug. 21, 2017.
Office action of U.S. Appl. No. 15/414,655 dated Aug. 14, 2017.
Office action of U.S. Appl. No. 15/447,784 dated Jun. 22, 2017.
Office action of U.S. Appl. No. 15/447,889 dated Jul. 17, 2017.
Office action of U.S. Appl. No. 15/480,919 dated Jul. 5, 2017.
Office action of U.S. Appl. No. 15/414,655, dated May 9, 2017.
Office action of U.S. Appl. No. 15/287,292, dated Dec. 15, 2017.
Aldrich (Sigma-Aldrich MSDS Lithium hexafluorophosphate {http://www.sigmaaldrich.com/MSDS/MSDS/DisplayMSDSPage.do?country=US&language=en&productNumber=450227&brand=ALDRICH} Printed Dec. 19, 2017).
Millipore (MSDS 1-Butyl-1-methylpyrrolidinium bis(trifluoromethylsulfonyl)imide high purity {http://www.emdmillipore.com/Web-US-Site/en_CA/-/USD/ProcessMSDS-Start?PlainSKU=MDA_CHEM-492046&Origin=PDF} date Nov. 4, 2014).
U.S. Office Action for U.S. Appl. No. 15/447,784, dated Dec. 28, 2017.
U.S. Office action for U.S. Appl. No. 15/844,689, dated Jan. 31, 2018.
Lewandowski et al. "Ionic liquids as electrolytes for Li-ion batteries—An overview of electrochemical studies", Journal of Power Sources, vol. 194, 2009, pp. 601-609.
Buzzeo et al. "Non-Haloaluminate Room-Temperature Ionic Liquids in Electrochemistry—A Review", ChemPhysChem, 2004, vol. 5, pp. 1106-1120.
Moreno et al. "Ionic Liquid Electrolytes for Safer Lithium Batteries", Journal of The Electrochemical Society, vol. 164, No. 1, 2017, pp. A6026-A6031.
European Search Report for Application EP17206661.5, dated Apr. 16, 2018.
U.S. Office Action for U.S. Appl. No. 15/480,904, dated Oct. 29, 2018.
U.S. Office Action for U.S. Appl. No. 15/480,911, dated Nov. 8, 2018.
U.S. Office Action for U.S. Appl. No. 15/480,922, dated Nov. 8, 2018.
U.S. Appl. No. 16/013,969, filed Jun. 21, 2018, Burshtain et al.
Final Office Action for U.S. Appl. No. 15/447,889, dated May 24, 2018.
Office Action for U.S. Appl. No. 15/480,888, dated Oct. 1, 2018.
Office action for U.S. Appl. No. 16/245,644, dated Mar. 1, 2019.
Notice of Allowance for U.S. Appl. No. 16/258,728, dated Mar. 6, 2019.

* cited by examiner

200

- Emulating a supercapacitor with given specifications by a fast-charging battery to yield an SCeFC — 205
- Configuring the fast-charging battery to emulate the supercapacitor with respect to specified requirements — 210
- Configuring physical dimensions of the battery to provide the required operation specifications — 220
- Determining the charging/discharging rate of the battery — 225
- Determining the working point and the partial operation range of the battery — 230
- Configuring the control circuitry of the battery to provide the required performance — 240
- Selecting the working point within an optimal operation window — 250
- Selecting the working point as a highly lithiated point within the optimal operation window to reduce relative expansion in operation — 255
- Modifying the battery to further enhance its performance within the operation range — 260
- Optimizing anode configuration under assumption of operation only around the working point and within the operation range — 265

*Figure 8*

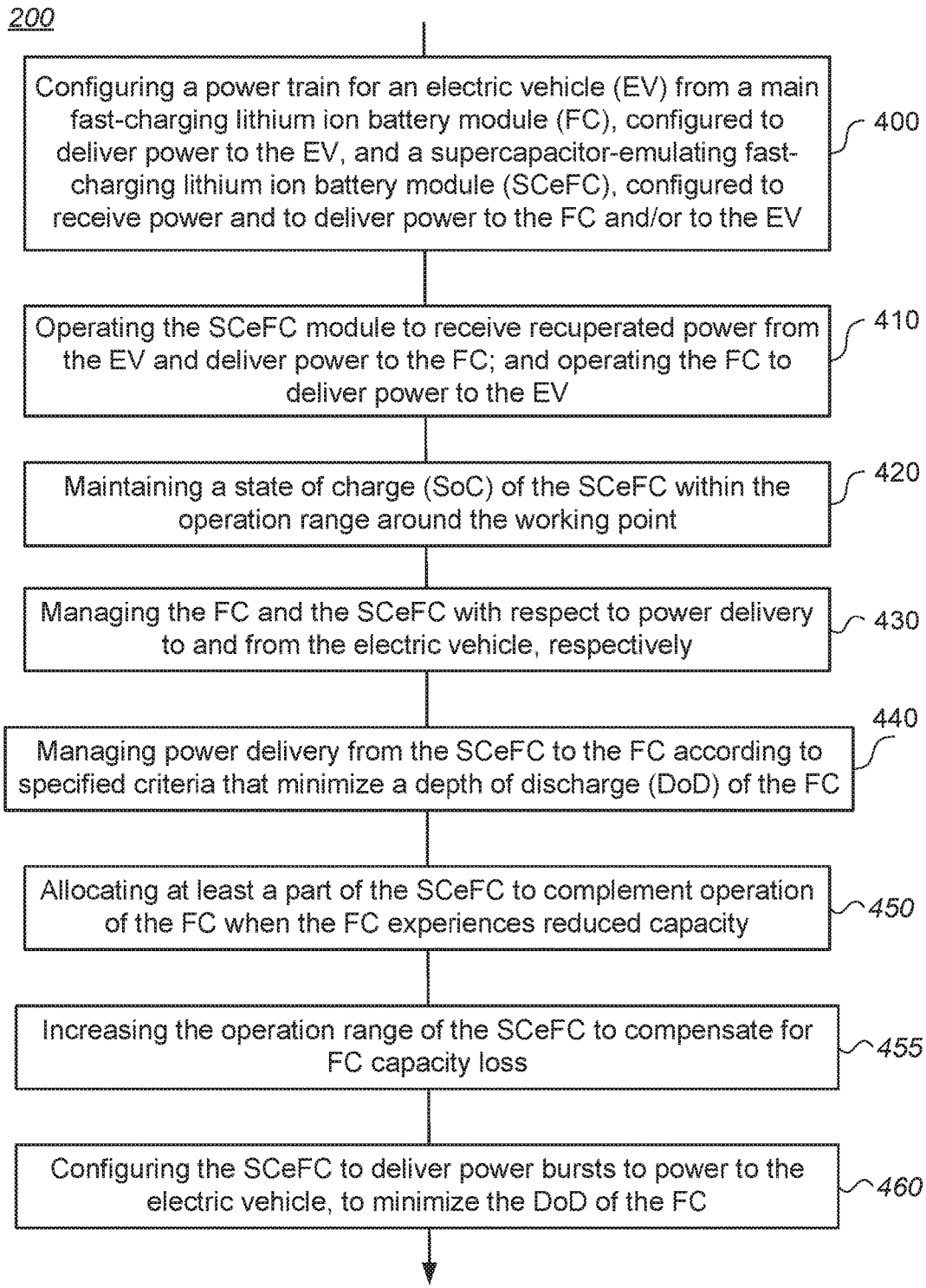
Figure 8 (Continued, 1.)

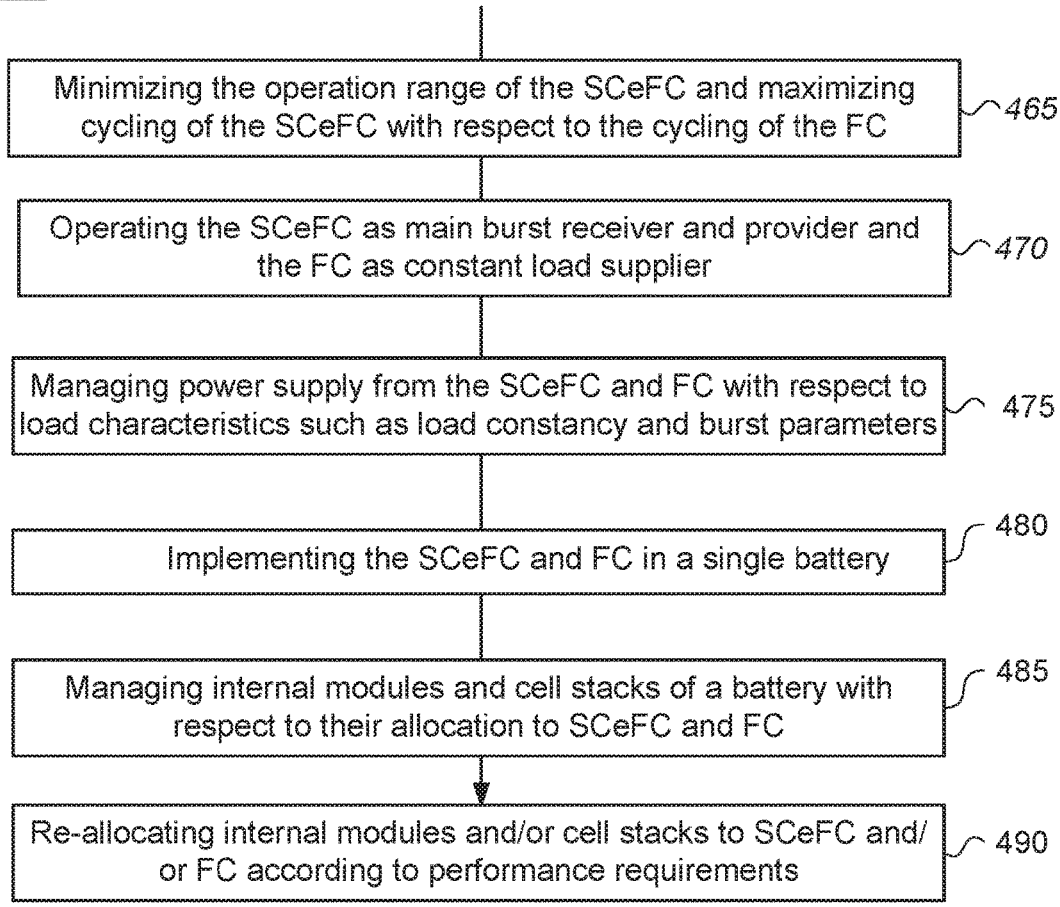
Figure 8 (Continued, 2.)

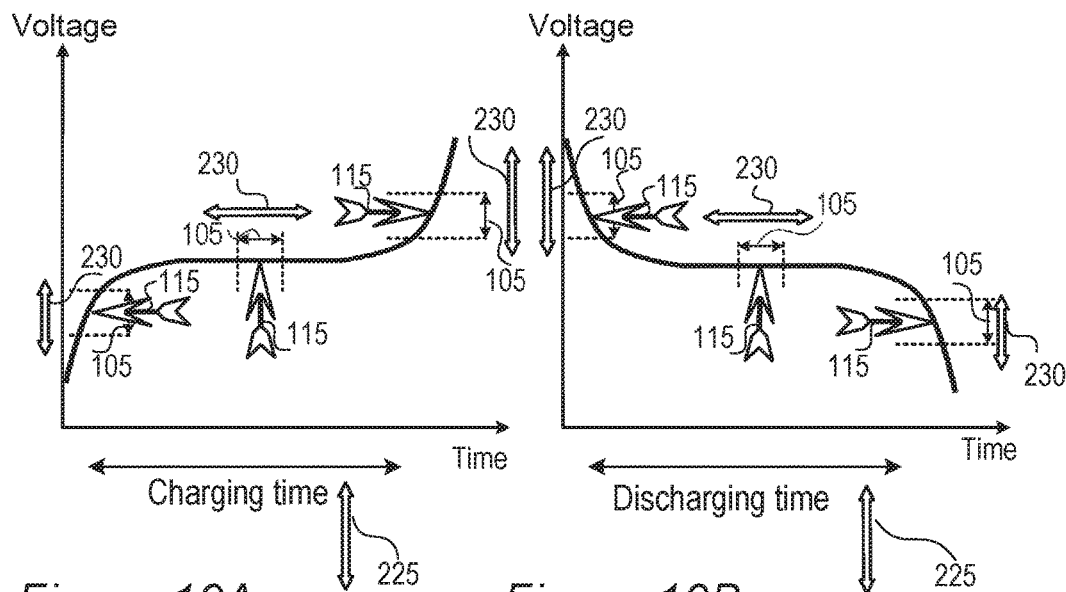
Figure 10A
Figure 10B
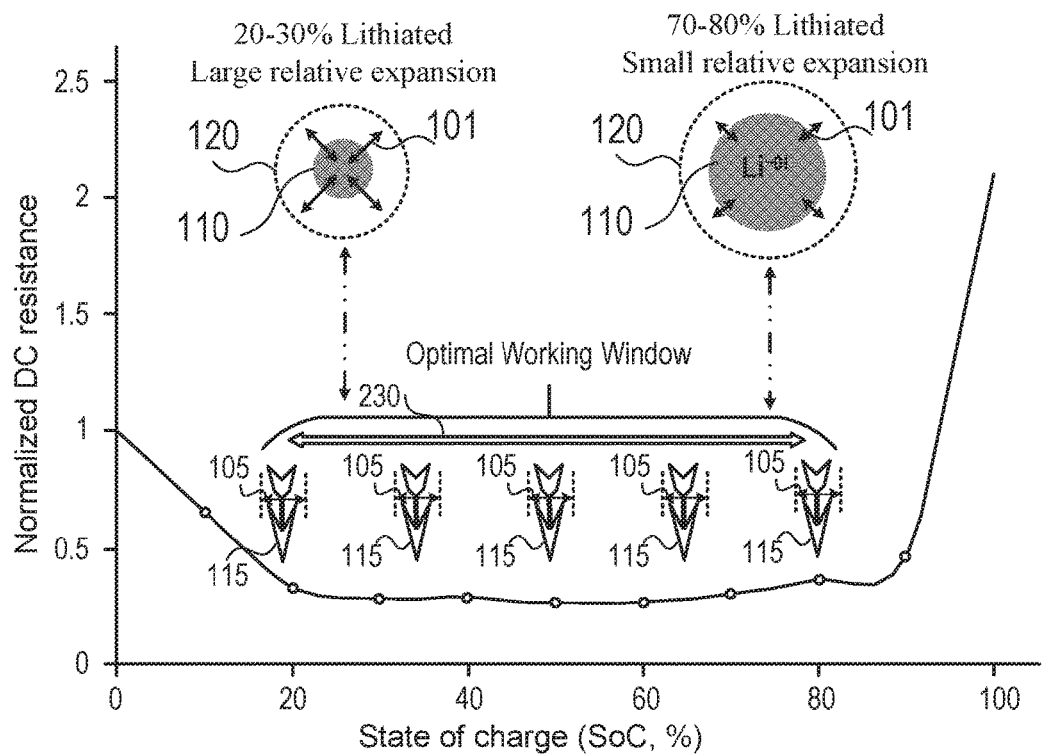
Figure 10C

ELECTRIC VEHICLES WITH ADAPTIVE FAST-CHARGING, UTILIZING SUPERCAPACITOR-EMULATING BATTERIES

CROSS REFERENCE TO RELATED APPLICATIONS

This application is a continuation-in-part of U.S. patent application Ser. No. 15/287,292, filed on Oct. 6, 2016, and entitled "SYSTEMS AND METHODS FOR ADAPTIVE FAST-CHARGING FOR MOBILE DEVICES AND DEVICES HAVING SPORADIC POWER-SOURCE CONNECTION", which claims the benefit of U.S. Provisional Patent Application No. 62/238,515, filed Oct. 7, 2015 and which is a continuation-in-part U.S. patent application Ser. No. 14/675,771, filed on Apr. 1, 2015, and entitled "SYSTEMS AND METHODS FOR ADAPTIVE FAST-CHARGING FOR MOBILE DEVICES AND DEVICES HAVING SPORADIC POWER-SOURCE CONNECTION", which claims the benefit of U.S. Provisional Patent Application No. 61/976,551 filed Apr. 8, 2014; this application is also a continuation-in-part of U.S. patent application Ser. No. 15/582,066 filed on Apr. 28, 2017, and entitled "SUPERCAPACITOR-EMULATING FAST-CHARGING BATTERIES AND DEVICES", which claims the benefit of U.S. Provisional Patent Application No. 62/434,432, filed on Dec. 15, 2016; this application is also a continuation in part of U.S. patent application Ser. No. 15/678,143, filed Aug. 16, 2017, which is a continuation in part of U.S. patent application Ser. No. 15/287,292, filed on Oct. 6, 2016, and entitled "SYSTEMS AND METHODS FOR ADAPTIVE FAST-CHARGING FOR MOBILE DEVICES AND DEVICES HAVING SPORADIC POWER-SOURCE CONNECTION", which claims the benefit of U.S. Provisional Patent Application No. 62/238,515, filed Oct. 7, 2015 and which is a continuation-in-part U.S. patent application Ser. No. 14/675,771, filed on Apr. 1, 2015, and entitled "SYSTEMS AND METHODS FOR ADAPTIVE FAST-CHARGING FOR MOBILE DEVICES AND DEVICES HAVING SPORADIC POWER-SOURCE CONNECTION", which claims the benefit of U.S. Provisional Patent Application No. 61/976,551 filed Apr. 8, 2014, all of which are incorporated herein by reference in their entireties.

BACKGROUND OF THE INVENTION

1. Technical Field

The present invention relates to the field of electric vehicles, and more particularly, to electric vehicles using fast-charging batteries.

2. Discussion of Related Art

Supercapacitors, also known as ultracapacitors, are capacitors with high capacitance which are used to provide electric energy bursts, i.e., short term high energy pulses. In these applications, supercapacitors are superior to batteries in their ability to deliver much more charge at a shorter time and in their ability to undergo many more charging and discharging cycles. The superior performance in these respects is due to the fact that the operation of supercapacitors is based on electrostatic energy storage while the operation of batteries is based on electrochemical redox reactions, which are generally slower and cause more electrode degradation over time. Supercapacitors are designed in various ways, such as double layer supercapacitors (e.g., electric double-layer capacitors (EDLC)), pseudocapacitors, hybrid capacitors etc.

There is a direct relation between the supercapacitor's physical size to the charge it can store and the energy it can deliver. Typical supercapacitors range from 0.001 Wh of stored energy for dimensions in the scale (order of magnitude) of 1 cm, weight of 1 gr and maximal current of 0.5-1 A (rated capacitance 1F) to 4 Wh of stored energy for dimensions in the scale (order of magnitude) of 10 cm, weight of 500 gr and maximal current reaching 2000 A with continuous currents reaching 200 A (rated capacitance 3000 F). Larger supercapacitors are made of multiple supercapacitor units to store and deliver larger energy ratings.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides an electric vehicle (EV) power train comprising: a main fast-charging lithium ion module (FC), configured to deliver power to the EV, a supercapacitor-emulating fast-charging lithium ion module (SCeFC), configured to receive power and to deliver power to the EV and/or to the FC, wherein both the FC and the SCeFC have anodes based on a same anode active material, and wherein the SCeFC is configured to operate at least at a maximal charging rate of 5 C and within an operation range of 5% at most around a working point of between 60-80% lithiation of the anode active material; and a control unit configured to: maintain a state of charge (SoC) of the SCeFC within the operation range around the working point, manage the FC and the SCeFC with respect to power delivery to and from the EV, respectively, and manage power delivery from the SCeFC to the FC and/or to the EV according to specified criteria.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 8 is a high level schematic flowchart illustrating a method of emulating a supercapacitor by a fast-charging battery, according to some embodiments of the invention.

FIGS. 10A-10C are high level schematic illustrations relating to the selection of working point and narrow operation range, according to some embodiments of the invention.

DETAILED DESCRIPTION OF THE INVENTION

Figure 1A:
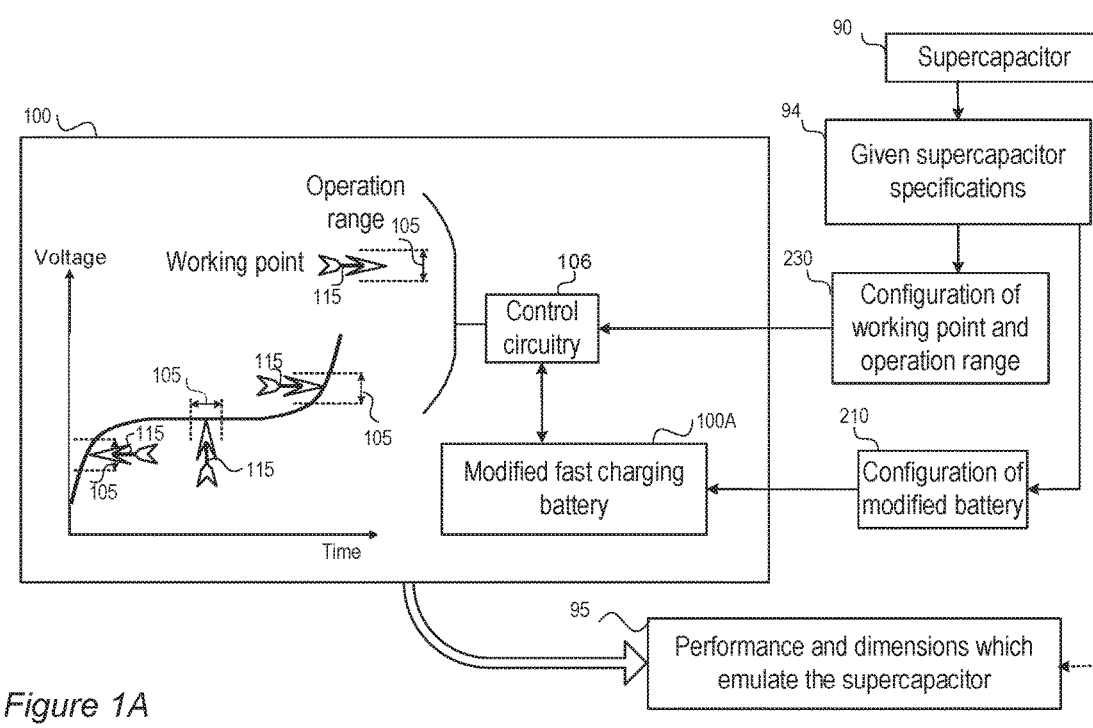
FIG. 1A is a high level schematic illustration of a device which emulates a supercapacitor using a modified fast-charging battery, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving", "monitoring", "managing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Electric vehicles (EVs), power trains and control units and methods are provided. Power trains comprise a main fast-charging lithium ion battery module (FC), configured to deliver power to the electric vehicle, a supercapacitor-emulating fast-charging lithium ion battery module (SCeFC), configured to receive power (e.g., from charging and/or EV regenerative braking) and deliver power to the FC and/or to the EV, and a control unit. Both the FC and the SCeFC have anodes based on the same anode active material (providing a significant advantage with respect to production and maintenance, e.g., anodes with Si, Ge, Sn and/or lithium titanate-based anode active material), and the SCeFC is configured to operate at high rates within a limited operation range of state of charge (SoC) (e.g., operate at least at a maximal charging and/or discharging rate of 5 C, or possible 10 C or 50 C) within an operation range of 5% at most around a working point of between 60-80% lithiation of the anode active material), maintained by the control unit, which is further configured to manage the FC and the SCeFC with respect to power delivery to and from the EV, respectively, and manage power delivery from the SCeFC to the FC according to specified criteria that minimize a depth of discharge and/or a number of cycles of the FC. Modules FC and SCeFC may be implemented as separate batteries or as a single battery in which internal modules and/or cell stack are operatively controlled as FC or as SCeFC according to the principles disclosed herein. Any of the following embodiments may be implemented as separate battery(ies) and/or as one or more battery modules.

Methods and supercapacitor-emulating fast-charging batteries are also provided. Methods comprise configuring a fast-charging battery to emulate a supercapacitor with given specifications (e.g., to provide the SCeFC) by operating the fast-charging battery only within a partial operation range which is defined according to the given specifications of the supercapacitor and is smaller than 20%, possibly 5% or 1%, of a full operation range of the fast-charging battery. The full operation range may be defined as any of (i) 0-100% state of charge (SoC) of the battery, (ii) potential 0-100% state of charge (SoC) of the anode material from which the battery is prepared (in case there are mechanical structures that limit the lithiation of the anode active material, as discussed below), (iii) the nominal capacity of the battery and/or equivalent definitions. Devices are provided, which comprise control circuitry and a modified fast-charging lithium ion battery having Si (silicon), Ge (germanium), Sn (tin) and/or LTO (lithium titanate)-based anode active material and designed to operate at 5 C at least and within a range of 5% at most around a working point of between 60-80% lithiation of the Si, Ge, Sn and/or LTO-based anode active material, wherein the control circuitry is configured to maintain the SoC of the battery within the operation range around the working point.

FIG. 1A is a high level schematic illustration of a device 100 which emulates a supercapacitor 90 using a modified fast-charging battery 100A, according to some embodiments of the invention. Device 100 may comprise modified fast-charging battery 100A configured to enable fast charging as explained below, and to operate within a narrow operation range 105 around a working point 115 as configured in configuration stages 210 disclosed below. Modified fast-charging battery 100A may be optimized to operate as part of device 100 and with respect to narrow operation range 105 and working point 115, as disclosed below. Device 100 may be used in power trains for EVs as SCeFC 100, described below (see e.g., FIG. 2).

Device 100 may further comprise a control unit 106 configured to operate modified fast-charging battery 100A within narrow operation range 105 around working point 115 to provide an output 95 which is equivalent to the output expected from corresponding supercapacitor 90 and/or according to given supercapacitor specifications 94, e.g., with respect to performance (e.g., currents, cycle life, capacity, etc.) and dimensions (e.g., size, weight) of corresponding supercapacitor 90. Device 100 may be designed to emulate any given supercapacitor 90 and/or any given supercapacitor specifications 94, as explained below. Different configurations of device 100 may be used to emulate corresponding different supercapacitors 90.

Control unit 106 may comprise various electronic components (e.g., diodes, switches, transistors etc.) as circuit elements configured to determine working point 115 and prevent charging and/or discharging modified fast-charging battery 100A outside a specified voltage range corresponding to operating range 105. For example, control circuitry 106 may comprise circuit elements (e.g., diodes, switches, transistors etc.) configured to prevent a charging current from reaching modified fast-charging battery 100A except in operation range 105 around working point 115.

Control circuit 106 may be configured to operate modified fast-charging battery 100A at narrow operation range 105 around working point 115, according to configuration parameters 230 such as the charging/discharging rate, dimension and other performance parameters of fast charging battery 100A determined with respect to the emulated supercapacitor 94, as disclosed below. In certain embodiments, the charging/discharging rate may be adjusted by selecting the working point at a specific SoC with respect to a given C-rate of the battery (see also FIG. 6A).

It is emphasized that the disclosed invention enables configuration of appropriate modified fast-charging battery 100A and/or device 100 for any given supercapacitor specifications, by configuring the dimensions of modified fast-charging battery 100A and the performance of modified fast-charging battery 100A and/or device 100 correspondingly.

The inventors have found out that for any given supercapacitor specifications, corresponding modified fast-charging battery 100A and/or device 100 may indeed be designed to emulate the given supercapacitor. Examples for given supercapacitor specifications include, e.g., any of: (i) rated capacitance 1 F, stored energy 0.001 Wh, volume of ca. 1 cm$^3$, weight of 1 gr and maximal continuous current of 0.5-1 A (depending on conditions); (ii) rated capacitance 10 F, stored energy 0.01 Wh, volume of 3 cm$^2$, weight of 3-4 gr and maximal continuous current of 2-4 A (depending on conditions); (iii) rated capacitance 100 F, stored energy 0.1 Wh, volume of ca. 10 cm$^3$, weight of 20-25 gr and maximal continuous current of 5-15 A (depending on conditions); (iv) rated capacitance 300-600 F, stored energy 0.3-0.8 Wh, volume of ca. 20-30 cm$^3$, weight of 50-150 gr and maximal continuous current of 20-90 A (depending on conditions); (v) rated capacitance 1500 F, stored energy 1.5 Wh, volume of ca. 50-60 cm$^3$, weight of ca. 300 gr and maximal continuous current of 80-150 A (depending on conditions); (vi) rated capacitance 3000-4000 F, stored energy 3-4 Wh, volume of ca. 100 Cm$^3$, weight of cal 500 gr and maximal continuous current of 130-200 A (depending on conditions); as well as larger supercapacitors and packs of supercapacitors, which may be emulated by modified fast-charging batteries 100A and/or devices 100, and/or packs thereof. The inventors have found out that modified fast-charging battery 100A and/or device 100 may be configured to replace any of the examples of supercapacitors listed above, and provide equivalent or even superior performance with respect to the given supercapacitor specifications.

It is noted that modified fast-charging battery 100A and/or device 100 may be used in a variety of applications where a supercapacitor is used, to replace the supercapacitor by equivalent modified fast-charging battery 100A and/or device 100 with respect to performance, specifications and physical dimensions. For example, modified fast-charging battery 100A and/or device 100 may be configured to emulate large supercapacitors (see examples above) and be integrated as such into an electrical power grid (alone or in an array of such devices) to smooth out spikes in energy demand. In another example, modified fast-charging battery 100A and/or device 100 may be configured to emulate small supercapacitors (see examples above) and be included in consumer electronics devices to ensure an even power supply for the device. In certain embodiments, modified fast-charging battery 100A and/or device 100 may be particularly advantageous with respect to the emulated supercapacitors in use cases which requires many short operation cycles, such as wireless sensors. As supercapacitors typically have a low energy density and high leakage currents, such scenarios typically exhaust supercapacitors quickly, while the much larger energy density and low leakage currents characterizing modified fast-charging battery 100A and/or device 100 may enable a much more extended operation of devices in such use cases.

Figure 1B:
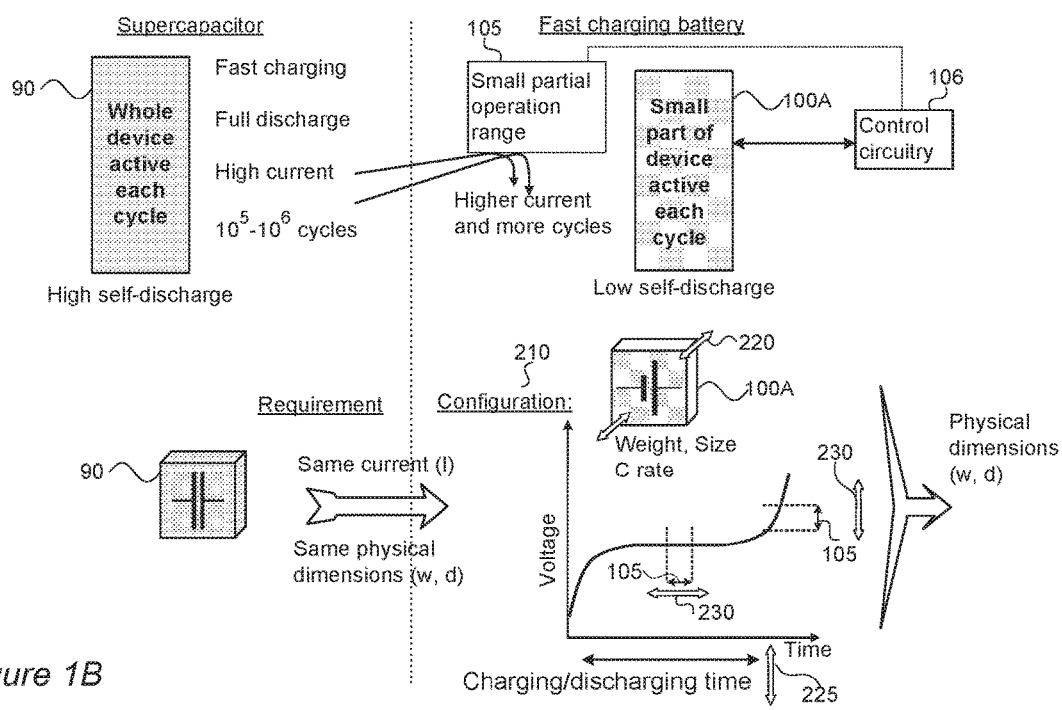
FIG. 1B is a high level schematic illustration of supercapacitor-emulating fast-charging battery and its configuration, according to some embodiments of the invention.

FIG. 1B is a high level schematic illustration of supercapacitor-emulating fast-charging battery 100A and its configuration, according to some embodiments of the invention. FIG. 8 is a high level schematic flowchart illustrating a method 200 of emulating a supercapacitor by a fast-charging battery and using the emulated supercapacitor in the power train of the electric vehicle, according to some embodiments of the invention. The method stages may be carried out with respect to battery 100. Method 200 may comprise stages for producing, preparing and/or using battery 100 and the power train, irrespective of their order. FIGS. 10A-10C are high level schematic illustrations relating to the selection of working point 115 and narrow operation range 105, according to some embodiments of the invention. FIGS. 10A, 10B illustrate schematically charging and discharging graphs, respectively and FIG. 10C illustrates an example for an optimal working window for selecting working point 115, as explained below.

As illustrated schematically in FIG. 1B, supercapacitors 90 are characterized by fast-charging rates typically having a charging time range of 2-20 sec (for the range of supercapacitors 90 presented in the Background of the Invention), full discharge in operation, high delivered currents (up to hundreds of amperes of continuous current per single supercapacitor unit) and operability over a large number of cycles ($10^5$-$10^6$ cycles). However, supercapacitors 90 typically suffer from relatively high self-discharge rates (leakage currents of about 1-3% of the maximal continuous current). Moreover, while the power density of supercapacitors 90 may be higher than the power density of lithium ion batteries, the energy density of lithium ion batteries is significantly larger (typically by several orders of magnitude) than the energy density of supercapacitors 90.

Charge and discharge rate are conventionally measured with respect to battery capacity (typically in terms of the ratio between the respective current and the capacity). Thus, a charging rate of C means that a battery will reach nominal capacity in one hour of charging. Likewise, a 1 C discharge rate means that a battery will deplete fully in 1 hour. As used herein, "fast charge" refers to a maximal charging rate of 5 C or greater.

Advantageously, fast-charging batteries (e.g., batteries configured to operate at a charge rate of at least about 5 C, and in embodiments at a rate of about 15 C to about 50 C and a discharge rate in embodiments of about 5 C) have low self-discharge rates (e.g., about 10% of the leakage current of a comparable supercapacitor), higher working potentials, shorter charging times and higher energy densities—which provide a significant advantage over supercapacitors 90. Fast charging lithium ion batteries that may be configured to emulate a supercapacitor according to the invention may be of any construction now known or hereafter developed, including those with metalloid-based anodes, as described in U.S. Pat. No. 9,472,804, which is incorporated by reference.

However, prior art fast-charging batteries typically provide lower currents (typically 1-10% of the continuous currents provided by a comparable supercapacitor) and operate for a smaller number of cycles (typically $10^3$ cycles) compared to supercapacitors 90, which typically provide higher currents and operate for a larger number of cycles (typically $10^5$-$10^6$ cycles).

Surprisingly, the inventors have figured out a way to emulate supercapacitors 90 by fast-charging batteries 100, thereby retaining the intrinsic advantages of fast-charging batteries while overcoming the prior art limitations and drawbacks of fast-charging batteries compared to supercapacitors 90.

Method 200 comprises configuring devices 100 and/or modified fast-charging battery 100A to emulate supercapacitor 90 with given specifications by operating the fast-charging battery only within a narrow partial operation range 105 around working point 115, which is defined according to the given specifications of supercapacitor 90 and is smaller than 20% of the full operation range of the fast-charging battery (see above). Partial operation range 105 may be determined according to the required performance and may be 20%, 10%, 5%, 1% or any other partial range of the full operation range of the lithium ion battery.

In certain embodiments, fast-charging battery 100A may be modified to be charged and discharged only over narrow operation range 105 around working point 115 or over a range including narrow operation range 105, but not over the full operation range of an unmodified fast-charging battery. For example, modified battery 100A may be designed to allow only small ranges of expansion of anode material particles 110 (see FIGS. 9A and 9B below and subsequent disclosure) and therefore not be operable as a regular lithium ion battery over a wide range of charging states.

Method 200 may be used to provide devices 100 and/or modified fast-charging batteries 100A which emulate a wide range of supercapacitors 90, at a corresponding wide range of operation specifications, as well as using the emulated supercapacitor in the power train of the EV. Fast-charging batteries 100A may be configured to emulate corresponding supercapacitors 90 with respect to different performance requirements, such as a same continuous current requirement, a same weight requirement, a same dimensions requirement and so forth, adjusting the unrestricted parameters of fast-charging battery 100A to emulate specific supercapacitor 90 using only partial operation range 105 of fast-charging battery 100A to equal the performance of specific supercapacitor 90. In certain embodiments, fast-charging batteries 100A may be configured to emulate supercapacitors 90 within a performance envelope defined by the given specifications, possibly without having any specific identical parameters (such as current or dimension). The performance envelope may be defined in terms of one or more of the parameters listed below and/or in terms of any combination thereof. Embodiments of modifications of fast-charging batteries 100A and configurations of devices 100 and control circuitry 106 are disclosed below.

Without being bound by theory, the inventors suggest that operating modified fast-charging batteries 100A over a partial operation range 105 enables larger continuous currents to be provided because only a small portion of the whole charging or discharging curve is utilized (see schematic illustration of a charging curve in FIG. 1B) and increases the number of cycles as in each cycle different areas of battery 100A are actually operative (see schematic illustration by the checkering of battery 100A in FIG. 1B) and therefore battery 100A in the disclosed operation mode can sustain a number of cycles which is, e.g., two to three orders of magnitudes larger than a typical battery operated over its full range—thereby bridging the gap to supercapacitors 90.

The following notation and units are used to denote the parameters of supercapacitors 90 (using the subscript SC for "supercapacitor", e.g., $E_{SC}$) and fast-charging batteries 100A (using the subscript FCB, e.g., $E_{FCB}$).

Energy parameters: The stored energy is denoted by E (Wh), and gravimetric and volumetric energy densities are denoted by $E_g$ (Wh/kg) and $E_v$ (Wh/l), respectively. The power density is denoted by P (W/kg).

Physical dimensions: The typical dimensions are characterized herein, in a non-limiting manner, by the unit's volume denoted by d ($cm^3$) and the weight is denoted by w (gr).

Performance parameters: The rated voltage is denoted by V (V), the maximal continuous current is denoted by I (A) and the charging time is denoted by t (1/C rate, e.g., for 50 C, t=1/50 in hours, with the C rate, or C ratio, being the charging or discharging current divided by the capacity).

Operation parameter: Partial operation range 105 in which fast-charging battery 100A is operated to emulate a given supercapacitor 90 is denoted by SoC (state of charge, %), e.g., in case fast-charging battery 100A is operated only at 2% of the total charging/discharging range of fast-charging battery 100A, then SoC=2% (see examples below).

Equations 1 present the relations between these parameters, which are valid for both supercapacitors 90 and fast-charging batteries 100A.

$$E = E_g \cdot w = E_v \cdot d = V \cdot I \cdot t / 3600 \text{ and } P = V \cdot I / w \qquad \text{Equations 1}$$

Non-limiting examples for these parameters are presented above.

It is noted that, as expressed in Equations 1, the charging/discharging time in seconds may be defined as t=E·3600/(V·I).

In order to emulate given supercapacitor 90 by fast-charging battery 100A, first their physical dimensions (e.g., sizes or weight) and performance parameters may be brought into approximate conformation (illustrated in FIG. 1B as configuration 210), depending on the exact performance requirements. For example, if a given continuous current is required, the physical dimensions of fast-charging battery 100A and possibly the charging/discharging rate may be adjusted (illustrated in FIG. 1B by adjustments 220 and 225, respectively). In another example, if given dimensions are required (e.g., at least of a weight and a size dimension), the charging/discharging rate may be adjusted (illustrated in FIG. 1B by adjustment 225) and in both cases partial operation range 105 is adjusted (illustrated in FIG. 1B by adjustment 230) in order to provide the required performance. See also FIG. 6A for additional configuration principles 360.

For example, when given requirement $I_{FCB}=I_{SC}$, the equation E=V·I·t/3600 from Equations 1 may be used to calculate the required stored energy $E_{FCB}$ in fast-charging battery 100A and partial operation range 105 may be determined by the ratio between $E_{SC}/E_{FCB}$ to emulate supercapacitor 90 by fast-charging battery 100A. In some embodiments, energy storage $E_{FCB}$ may be traded off with respect to battery dimensions $d_{FCB}$, $w_{FCB}$ to adjust battery parameter.

In another example, when given requirement $w_{FCB}=w_{SC}$, the equation E=VI/t from Equations 1 may be used to calculate the required current $I_{FCB}$ and/or charging time $t_{FCB}$ in fast-charging battery 100A and partial operation range 105 may be determined by the ratio between $E_{SC}/E_{FCB}$ to emulate supercapacitor 90 by fast-charging battery 100A.

Tables 1 and 2 provide examples of configurations of fast-charging battery 100A at two extremes of the range of parameter specifications of supercapacitors 90.

TABLE 1

Configuration of fast-charging battery at two extreme supercapacitor specifications, denoted as small and large supercapacitors 90, under condition of same stored energy.

|  | Small supercapacitor 90 | Fast-charging battery 100A | Large supercapacitor 90 | Fast-charging battery 100A |
|---|---|---|---|---|
| Stored energy | 0.001 Wh | | 3.04 Wh | |
| Gravimetric energy density | 0.9 Wh/kg | 0.9 Wh/kg | 6 Wh/kg | 11.8 Wh/kg |
| Volumetric energy density | 1.7 Wh/l | 3.6 Wh/l | 7.7 Wh/l | 43.4 Wh/l |
| Power | 2,400 W/kg | 2,500 W/kg | 12,000 W/kg | 8,500 W/kg |
| Rated voltage | 2.7 V | 3.35 V | 2.7 V | 3.35 V |
| Maximal continuous current | 0.7 A | 0.8 A | 210 A | 600 A |
| Dimensions | 12 mm · 8 mm | 0.4 mm · 6.25 cm² | 138 mm · 60.4 mm | 84 mm · 80 cm² |
| Volume | 0.6 cm³ | 0.3 cm3 | 395 Cm³ | 70 cm³ |
| Weight | 1.1 g | 1.1 g | 510 g | 260 g |
| ESR* | 700 mOhm | | 0.29 mOhm | |
| Charging time** | 1.9 sec | 1.2 sec | 19.3 sec | 5 sec |

Table 1 illustrates, in non-limiting examples, the ability to emulate supercapacitors 90 at two extrema of their range of configurations by corresponding fast-charging batteries 100A, which achieve similar or even superior performance.

TABLE 2

Configuration of fast-charging batteries for different types of requirements, at two extreme supercapacitor specifications.

|  | Small supercapacitor | | Large supercapacitor | |
|---|---|---|---|---|
| Requirement: | Fixed current | Fixed weight | Fixed current | Fixed weight |
| Charging speed and % discharge | 50 C @ 2% | 50 C @ 1.7% | 50 C @ 22% | 50 C @ 3.6% |
| Stored energy | 0.046 Wh | 0.056 Wh | 13.86 Wh | 85.46 Wh |
| Gravimetric energy density | 50 Wh/kg | 50 Wh/kg | 170 Wh/kg | 170 Wh/kg |
| Volumetric energy density | 200 Wh/l | 200 Wh/l | 600 Wh/l | 600 Wh/l |
| Power | 2,500 W/kg | 2,500 W/kg | 8,500 W/kg | 8,500 W/kg |
| Rated voltage | 3.35 V | 3.35 V | 3.35 V | 3.35 V |
| Maximal continuous current | 0.7 A | 0.8 A | 210 A | 1180 A |
| Dimensions | 3.6 mm · 0.55 cm², or 0.3 mm · 6.25 cm² | 5.4 mm · 0.55 cm², or 0.45 mm · 6.25 cm² | | 84 mm · 160 Cm² |
| Volume | 0.2 cm³ | 0.3 cm³ | | 140 Cm³ |

TABLE 2-continued

Configuration of fast-charging batteries for different types of requirements, at two extreme supercapacitor specifications.

| | Small supercapacitor | | Large supercapacitor | |
|---|---|---|---|---|
| Requirement: | Fixed current | Fixed weight | Fixed current | Fixed weight |
| Weight | 0.9 g | 1.1 g | 110 g | 510 g |
| ESR | ~100 mOhm | ~100 mOhm | ~0.5 mOhm | ~0.1 mOhm |

Table 2 illustrates, in non-limiting examples, the ability to emulate supercapacitors 90 at two extrema of their range of configurations and according to different specifications requirements, by corresponding fast-charging batteries 100A, which achieve similar or even superior performance.

Certain embodiments comprise control circuitry 106 of fast-charging battery 100A which is configured to provide the respective specified current and operate fast-charging battery 100A only within limited discharging range 105.

In the disclosed power train embodiments, two operatively different types of battery modules are provided, one type (fast charging module) which is configured to provide continuous power demands (having high energy density) of the EV and another type (supercapacitor emulation module) which is configured to handle power bursts (having high power density) such as by providing power bursts and receiving power bursts.

Figure 2:
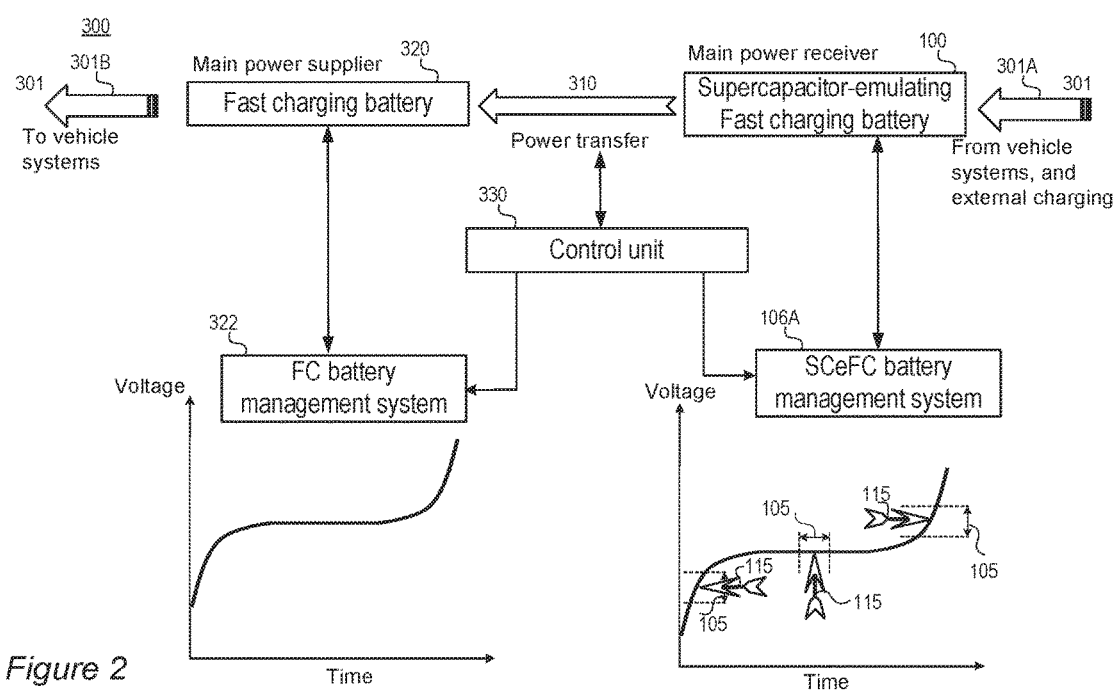
FIG. 2 is a high level schematic illustration of a power train of an electric vehicle, according to some embodiments of the invention.

FIG. 2 is a high level schematic illustration of a power train 300 of an electric vehicle (EV) 301, according to some embodiments of the invention. Power train 300 of electric vehicle 301 (such as, as non-limiting examples, electric cars, electric trucks, electric buses, electric motorcycles, electric off-highway vehicles, electric forklifts etc.) may comprise a main fast-charging lithium ion module (FC) 320, configured to deliver power 301B to EV 301 (represented schematically as vehicle systems, such as vehicle systems providing power and vehicle systems receiving power, denoted 302A, 302B, respectively, in FIG. 3A), supercapacitor-emulating fast-charging lithium ion module (SCeFC) 100, configured to deliver power 310 to FC 320 and receive recuperated power 301A (e.g., from regenerative braking) from EV 301.

In general, in embodiments corresponding to such scenario, power train 300 is configured to allocate SCeFC 100 to use recuperated energy to minimize a depth of discharge (DoD) of FC 320, by using any available energy from recuperation to charge FC 320. As DoD affects lifetime in a non-linear manner (linear increases in DoD degrade the lifetime in accelerated manner, see below), the inventors may optimize the tradeoff between the number of charging/discharging cycles applied to FC 320 and the DoD that FC 320 experiences (see e.g., FIG. 6A).

Both FC 320 and SCeFC 100 may have anodes 108 with Si (silicon), Ge (germanium), Sn (tin) and/or LTO (lithium titanium oxide, lithium titanate)-based anode active material 110 (and/or 110A, 110B, 110C, see FIGS. 9A, 9B below), possibly providing power train 300 based on a single type of anode material.

SCeFC 100 may be configured to operate at 5 C at least and within operation range 105 of 5% at most around working point 115 of between 60-80% lithiation of the Si, Ge, Sn and/or LTO-based anode active material 110 (and/or 110A, 110B, 110C).

Power train 300 may further comprise a control unit 330 configured to maintain a state of charge (SoC) of SCeFC 100 within operation range 105 around working point 115, manage FC 320 and SCeFC 100 with respect to power delivery to and from vehicle 301, denoted schematically 301B and 301A respectively, and manage power delivery 310 from SCeFC 100 to FC 320 according to specified criteria that minimize a depth of discharge of FC 320. For example, FC 320 may be associated with FC battery management system (FC BMS) 322 and SCeFC 100 may be associated with SCeFC battery management system (SCeFC BMS) 106A, possibly comprising control circuitry 106. It is noted that FC BMS 322 and SCeFC BMS 106A are configured to manage respective FC and SCeFC modules, which may be implemented both in a single battery or in two or more separate batteries, as explained below. In single battery implementations, FC BMS 322 and SCeFC BMS 106A may be configured to manage respective FC and SCeFC modules in the single batteries.

Advantageously, while FC 320 provides high energy density in power train 300, SCeFC is 100 configured, as described above, to provide high power density to power train 300, to complement FC 320 in operating power train 300 of EV 301.

Advantageously, SCeFC 100 may be configured to buffer multiple energy inputs 301 rom vehicle systems 301, which are irregular in extent and timing, and provide regulated power 310 to FC 320 in correspondence to the optimal operation thereof. As SCeFC 100 may be configured to be operable over a very large number of cycles (e.g., 10,000's cycles, as explained and demonstrated above), SCeFC 100 can withstand the erratic energy inputs 301A without reduction of the cycle lifetime of power train 300. Moreover, as the actual capacity of SCeFC 100 is much higher than its operation range 105, it may also be used to receive peaks of power 301A and thereby increase the extent and efficiency of energy recuperation, as exemplified in Table 3 below. The combination of FC 320 and SCeFC 100 in disclosed embodiments may therefore extend the cycle lifetime of power train 300 beyond the cycle lifetime of FC 320 (as SCeFC 100 buffers much of the cycling), for example two-fold, three-fold or even ten-fold. e.g., from hundreds of cycles for FC 320 to thousands of cycles for power train 300 (or, in various embodiments, from 300-500 cycles for FC 320 to 600-2000 cycles for power train 300). Alternatively or complementarily, power train 300 may provide increased capacity and/or larger recuperation extent and efficiency than FC 320 operated by itself. Alternatively or complementarily, power train 300 may improve cost and/or size parameters, as explained in the examples above for SCeFC 100 alone and as illustrated for power train 300 in Table 3 below.

Table 3 presents a schematic, non-limiting comparison of power trains for electric vehicles. The power trains are compared under various assumptions: The first three columns present parameters for single battery module solutions, with current lithium ion batteries (first column) and with fast charging batteries (second and third columns) based on disclosed anodes 108 with Si, Ge and/or Sn-based anode active material 110 (and/or 110A, 110B, 110C, see FIGS. 9A, 9B below, and/or possibly alternative anode active material for fast charging batteries such as lithium titanate, LTO). For all solutions an average energy consumption of 17.5 kWh per hour is assumed.

The first three single battery module solutions receive power 301A as well as provide power 301B from and to vehicle systems 301, respectively, as single battery module solutions. The first and second columns assume 100 kWh battery packs, while the third column assumes a 80 kWh battery pack, which is configured to provide similar range and driving time as the first column solution (prior art Li ion battery). Both fast charging battery alternatives provide higher energy recuperation through their ability to be fast charged, and therefore ability to receive and deliver more energy than slow charging prior art batteries (based e.g., on graphite anodes). The second column solution uses the additional energy to increase driving time and range while the third column solution uses the additional energy to reduce battery size. It is noted that the fast charging solutions are characterized by more effective charging cycles per day, which may reduce the time for reaching the overall number of available cycles (cycle lifetime). Overall, the second column solution increases the range of the electric vehicle due to more efficient recuperation while the third column solution reduces the size and cost of the battery pack, with both solutions requiring an increased (ca. double) number of cycles.

The fourth and fifth columns present parameters of two batteries solutions, which are illustrated schematically in FIG. 2, and both improve battery pack performance and maintain or enhance the cycle lifetime of the battery pack. It is noted that the two batteries may as well be implemented as two modules in a single battery, as explained below. In both cases all recuperation (receipt of power 301A from vehicle systems 301) is carried out by SCeFC 100, and it is assumed that 60 kWh are recuperated. The forth column solution represents a larger battery pack of 80+60=140 kWh, while the fifth column solution provides the same battery pack capacity as the first single battery solution. Both the fourth and fifth column solutions are configured to provide the same drive time and range as the first single battery solution (despite the larger capacity of the forth column solution and the larger recuperation of the fifth column solution), due to partial operation range 105 of SCeFC 100 which is configured to support a very large number of cycles, as explained above.

The partial operation is expressed in the charging cycles per day (>20 for operation range<5% SoC; and >300 for operation range<1% SoC for fourth and fifth column solutions, respectively), with corresponding performance parameters of energy per % SoC and pulse frequency. In both cases FC 320 receives power 310 from SCeFC 100 only, enabling optimized operation thereof and maximization of its cycle lifetime (see e.g., FIG. 6A). The inventors note that Table 3 provides non-limiting schematic examples to explain the operation and advantages of embodiments of the disclosed inventions, which may be configured according to the disclosed guidelines to provide any required performance requirements concerning the relations between the electric vehicle, the battery pack parameters and the configuration of SCeFC 100, FC 320 their corresponding BMS's 106A, 322, respectively and control unit 330. Lifetime estimations are suggested as number of charge/discharge cycles and are very crude, intended to suggest the improvement in disclosed embodiments, and are not to be understood as limiting.

TABLE 3

Comparison of power trains for electric vehicles.

|  | Single prior art battery (1) | Single fast charging battery (2) | Single fast charging battery (3) |
| --- | --- | --- | --- |
| Battery Pack | 100 kWh | 100 kWh | 80 kWh |
| % of Recuperation | 40% | 80% | 80% |
| Recuperation Energy | 40 kWh | 80 kWh | ~60 kWh |
| Total Energy | 140 kWh | 180 kWh | 140 kWh |
| Driving time | 8 hours | 10 hours | 8 hours |
| Average Energy Consumption | 17.5 kWh per hour | 17.5 kWh per hour | 17.5 kWh per hour |
| Average Recuperation | 4 kWh per hour | 8 kWh per hour | 8 kWh per hour |
| Range | 300 km | 385 km | 300 km |
| Charging per day | 1 | 1 | 1 |
| Effective charging per day | ~1.5 | ~2 | ~2 |
| Lifetime (cycles) |  | 300-500 | 300-500 |

|  | Two batteries (hybrid) - FC and SC-emulating FC (4) | | Two batteries (hybrid) - FC and SC-emulating FC (5) | |
| --- | --- | --- | --- | --- |
| Battery Pack | 80 kWh | 60 kWh | 80 kWh | 20 kWh |
| % of Recuperation | 0% | 100% | 0% | 300% |
| Recuperation Energy |  | 60 kWh |  | 60 kWh |
| Total Energy | 140 kWh | | 140 kWh | |
| Driving time | 8 hours | | 8 hours | |
| Average Energy Consumption | 17.5 kWh per hour | | 17.5 kWh per hour | |
| Average Recuperation | 8 kWh per hour | | 8 kWh per hour | |
| Range | 300 km | | 300 km | |
| Charging per day | 1 | >20 (<5% SoC) | 1 | >300 (<1% SoC) |
| Effective charging per day | 1 | 1 (<5% SoC) | 1 | 1 (<1% SoC) |

TABLE 3-continued

Comparison of power trains for electric vehicles.

| Energy per % SoC | 3 kWh | 0.2 kWh |
| Pulse frequency | ~20 min | 1.5 min |
| Lifetime (cycles) | 1,000-2,000 | >5,000-20,000 |

Advantageously, due to the larger extent of power recuperation and the controlled discharging of FC 320 cycle lifetime may be prolonged with respect to single battery solutions (e.g., presented in second and third columns) with the same overall capacity, as the DoD degrades the cycle lifetime non-linearly—low DoDs of 10-40% typically enable thousands of cycles while deep DoDs of ca. 60-100% typically enable only hundreds of cycles. In certain embodiments, control unit 330 may be configured to buffer the DoD of FC 320 by discharging SCeFC 100 at high demands, thereby reducing the DoD of FC 320 and increasing its cycle lifetime.

Moreover, also concerning SCeFC 100 the regulation of DoD may be used to increase its cycle lifetime. In the presented examples, the fourth column solution provides a larger battery pack which is operated under relatively relaxed conditions (relatively wide operation range, relatively low pulse frequency), while the fifth column solution provides a smaller battery pack (similar to the first column solution) which is operated under stricter conditions (narrower operation range, higher pulse frequency), which enable longer cycle lifetime, as it maintains a smaller DoD. For example, the presented fifth column solution provides a cycle lifetime of SCeFC 100 which may be three to ten times longer than the cycle lifetime of SCeFC 100 in the fourth column solution.

Regarding the schematic and non-limiting lifetime estimation for power train 300 (of compound battery system, including FC 320 and SCeFC 100), embodiments presented in the fourth column provide an increase of estimated 3 to 10 times with respect to single battery solutions (columns 2 and 3) by using SCeFC 100 to buffer energy bursts, reduce the number of cycles and/or reduce DoD of FC 320. Embodiments presented in the fifth column may provide a further increase of estimated 5 to 10 times with respect to the forth column solution due to the narrowing of operation range 105 (5% to 1% SoC) and the non-linear dependence of the lifetime of FC 320 on the DoD, as explained above. Even assuming linear dependence on DoD, reduction of operation range 105 provides the factor of 5 in lifetime, due to operation at 1% SoC instead of 5% SoC. The non-linear dependence of lifetime of DoD enables to push this advantage even further, using SCeFC 100 for a larger proportion of the cyclings with respect to FC 320, for example, in the fifth column solution, FC 320 may be used at a single charging per day and SCeFC 100 may be used at 300 charges per day for SCeFC 100 run at 1% SoC.

It is emphasized that the separation of power train 300 into one FC 320 and one SCeFC 100 is provided here in a non-limiting manner and only as an example. In various embodiments, FC 320 and SCeFC 100 may be implemented as a single battery module having separate controls on different parts thereof, corresponding to FC 320 and SCeFC 100 (which may also be designed differently internally, as disclosed herein) and/or multiple batteries may be used as FC 320 and/or as SCeFC 100, either in battery packs sharing controllers or as multiple batteries for performing each function.

In certain embodiments, control unit 330 may be configured to utilize SCeFC 100 for providing additional power in case FC 320 is exhausted, e.g., for extending the range of the electric vehicle. In such cases, SCeFC 100 may be operated as main power supplier once the power in FC 320 is depleted.

In certain embodiments, control unit 330 may be configured to adapt the operation configuration of SCeFC 100 to compensate for reduced SoH of FC 320. For example, if a part of FC 320 becomes damaged or non-functional, control unit 330 may be configured to allocate a part of SCeFC 100 to compensate for the capacity loss of FC 320. In certain embodiments, control unit 330 may be configured to allocate up to whole SCeFC 100 to replace capacity loss of FC 320. In certain embodiments, control unit 330 may be configured to operate SCeFC 100 at larger operation ranges 105 to provide the required additional power.

Power from SCeFC 100 and FC 320 in power train 300 may be provided to EV 301 in a wide range of scenarios, which may be optimized with respect to performance and route parameters. In the following, two non-limiting types of scenarios are presented—the first one involving power supply only from FC 320 to EV 301 (with SCeFC 100 providing power to FC 320 and not directly to EV 300) and the second one involving power supply from either SCeFC 100 and FC 320 to EV 300, with additional power transfer from SCeFC 100 to FC 320 to increase its level of charging. Elements from either scenario may be combined and/or scenarios may be switched by control unit 330 during operation. Control unit 330 may be configured to optimize energy flow to, within and from power train 300 according to various parameters disclosed below, such as any of the state of the battery modules, the power requirements and supply, route and weather parameters and external adjustments.

Figure 3A:
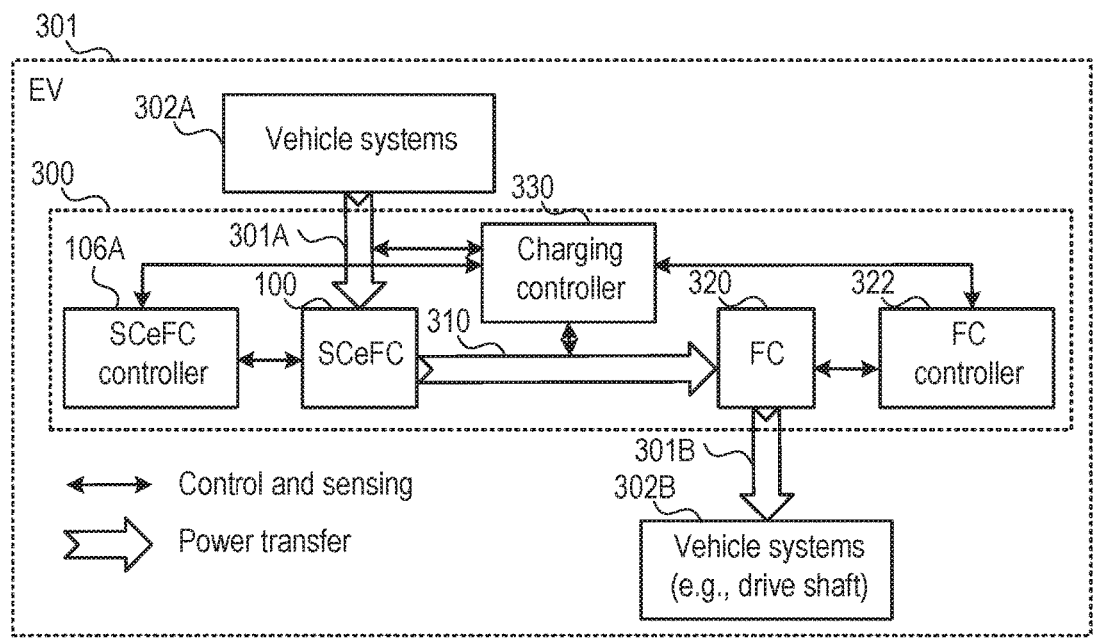
FIGS. 3A-3C are high level schematic illustration of system configurations, operation algorithms and examples of the power train of the electric vehicle, according to some embodiments of the invention.
Figure 3B:
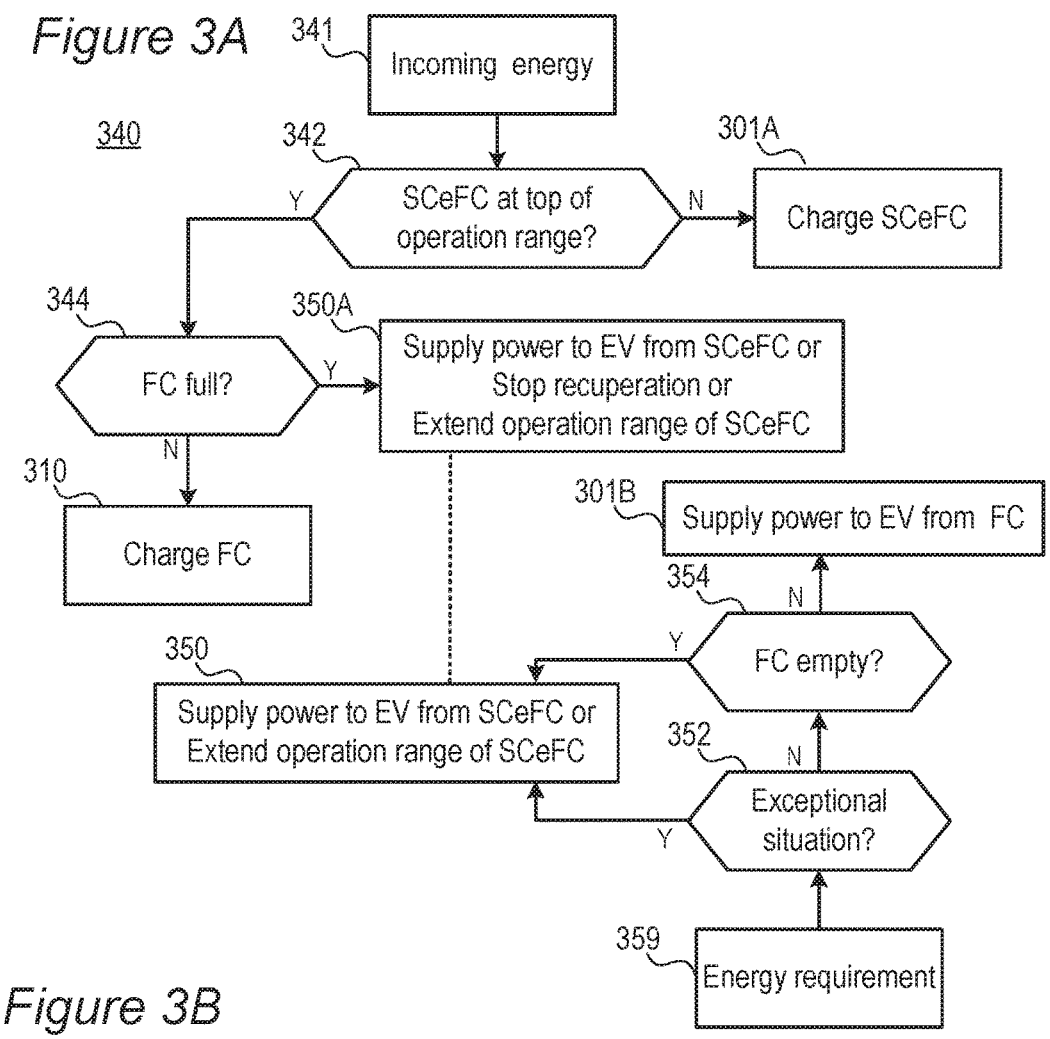
Figure 3C:
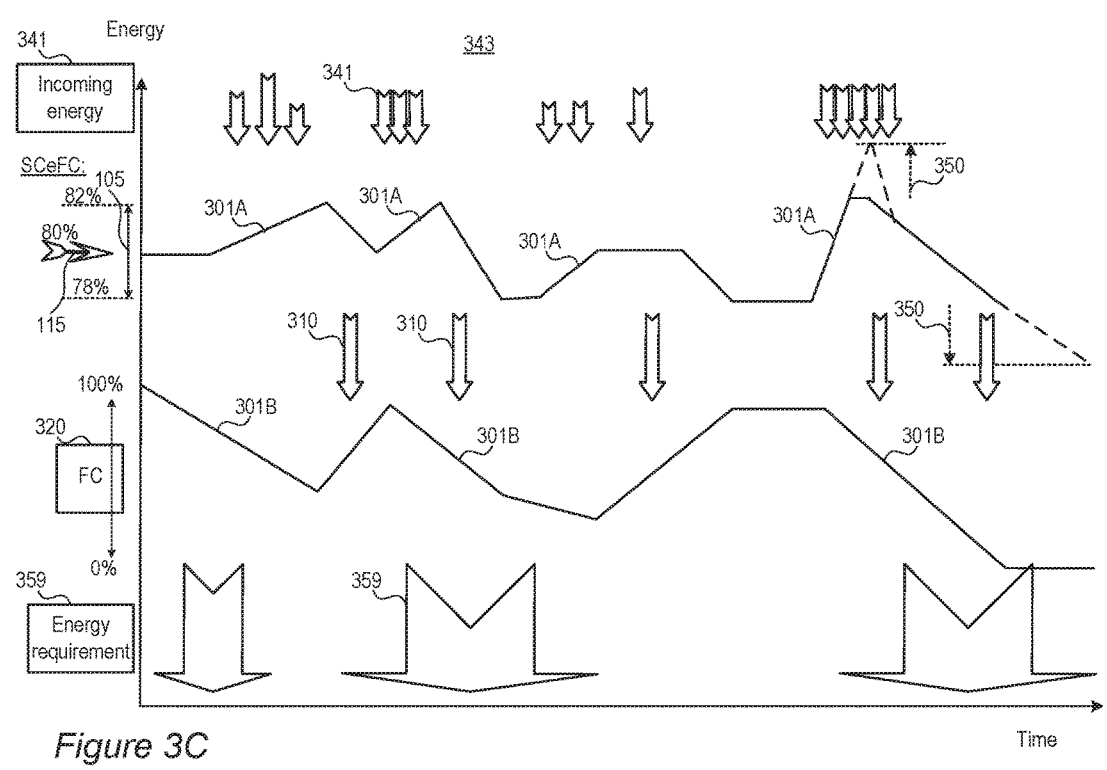

FIGS. 3A-3C are high level schematic illustration of system configurations, operation algorithms 340 and examples 343 of power train 300 of electric vehicle 301, according to some embodiments of the invention.

FIG. 3A illustrates schematically power train 300 in vehicle 301, according to some embodiments of the invention. Vehicles systems 302A such as brakes are illustrated as power providers while vehicles systems 302B such as the drive shaft are illustrated as power consumers, without loss of generality. Power transfer to vehicles systems 302B may be carried out from FC 320 (power 301B). FC 320 may be provided with power 310 from SCeFC 100, after storage of power bursts therein, received (301A) from vehicles systems 302A. Charging controller 330 may be configured to control each of power transfers 301A, 310, 301B directly and/or through corresponding SCeFC controller 106A and FC controller 322. Charging controller 330, SCeFC controller 106A and FC controller 322 may comprise or be part of control unit 330, SCeFC BMS 106A and FC BMS 322 illustrated in FIG. 2. It is noted that, in any of the embodiments, the terms controller and BMS may be used alternately, or may represent hierarchically arranged unit, possibly partly or fully integrated in control unit 330.

FIG. 3B illustrates schematically a high-level operation scheme 340 of power train 300 in vehicle 301, according to some embodiments of the invention. Incoming energy 341, e.g., energy received from vehicle systems 301 and/or charged energy, may be delivered to and be stored in SCeFC 100 (as power transfer 301A) if SCeFC 100 is not at the top of its operation range 105 (see 342). If SCeFC 100 is at the top of its operation range 105 (see 342), FC 320 may be charged 310 therefrom, while SCeFC received complementary energy 341, if FC 320 is not full (see 344). If both SCeFC 100 and FC 320 are at their uppermost defined capacity, any of the following options may be implements (see 350A): stopping recuperation (losing incoming recuperated energy from incoming energy 341), supplying power to vehicle systems (301B) directly from SCeFC 100 (see also FIG. 3C below) and/or extending operation range 105 of SCeFC 100, if possible physically and if such exception is predefined as available. Considering energy consumption, for energy requirements 359, e.g., energy consumed by vehicle systems 301, if no exceptional situation exists (see 352) and FC 320 is not empty (see 354), power may be supplied (301B) from FC 320. Exceptional situations and/or empty FC 320 may be handled by (see 350): supplying power to vehicle systems (301B) directly from SCeFC 100 (see also FIG. 4 below) and/or extending operation range 105 of SCeFC 100, if possible physically and if such exception is predefined as available.

Figure 6A:
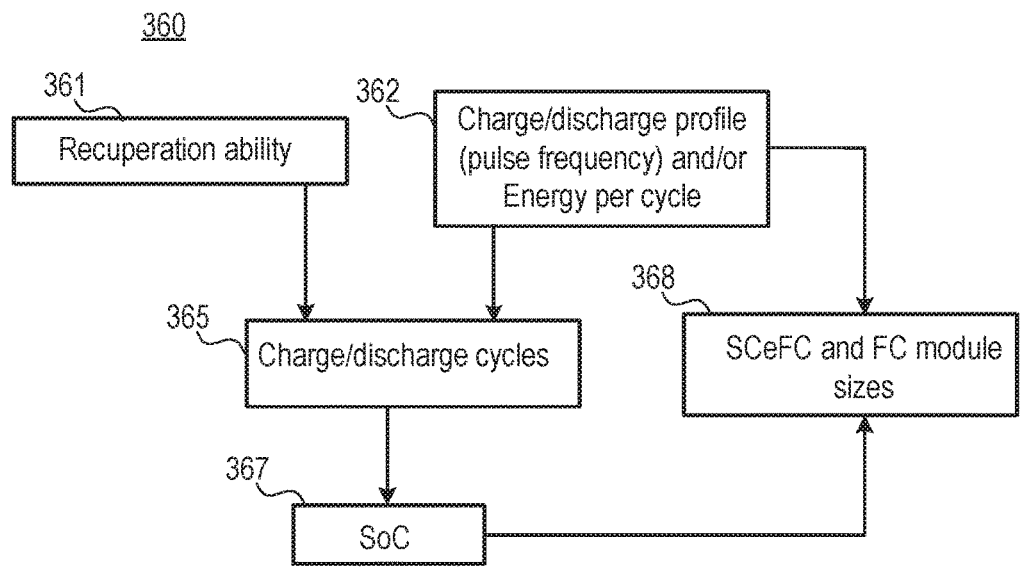
FIG. 6A illustrates schematically a high-level flowchart of an algorithm for optimizing module sizes of FC and SCeFC of the power train in the vehicle, according to some embodiments of the invention.

It is noted that working point 115 and operation range 105 of SCeFC 100 may be configured to comply to certain expected amounts of incoming recuperated energy of incoming energy 341 and/or certain maximal energy recuperation criteria, which may significantly affect the overall energy efficiency of vehicle 301. FIG. 6A below and related embodiments address processes for determining these parameters.

FIG. 3C is a high-level schematic non-limiting qualitative example, according to some embodiments of the invention, for operation of power train 300 in an arbitrary scenario 343 of power supply, such as bursts of incoming energy 341 (e.g., recuperated energy and/or, alternatively or complementarily, bursts of charged energy from a charging station) indicated by arrows at the top part of the diagram, and power requirements 359, indicated schematically by the thick arrows at the bottom part of the diagram. In operation scheme 340 along the principles outlined in FIGS. 2, 3A and 3B, SCeFC 100 is operated as main power receiver (301A) and buffers incoming energy bursts 341 to reduce the number of chargings 310 of FC 320 and thereby reduce the number of cycles undergone by FC 320. It is noted that a tradeoff may be optimized between a number of charging and discharging cycles of FC 320 and the DoD of FC 320 to maximize its overall lifetime (see e.g., FIG. 6A). FC 320 as main power supplier (301B) in embodiments corresponding to presented scenario 340 delivers required energy 359. An exceptional scenario 350 of extending operation range 105 is illustrated schematically at the righthand side of the diagram (in either direction—above the maximal SoC to receive more regenerated energy, or below the minimal SoC to provide additional power, e.g., if FC 320 is drained, not shown). Exceptional scenario 350 may be required as emergency scenario, e.g., in case FC 320 is unavailable, possibly in repair mode of FC 320, for exceptional range extension requirements, or possibly for enhanced recuperation under certain circumstances, as explained below. In the illustrated example, SCeFC 100 is shown to be operated at ±2% operation range 105 around 80% lithiation as working point 115, without loss of generality. It is noted that SCeFC 100 is generally operated with a much higher charging and discharging C rate than FC 320, using its high cyclability.

Figure 4:
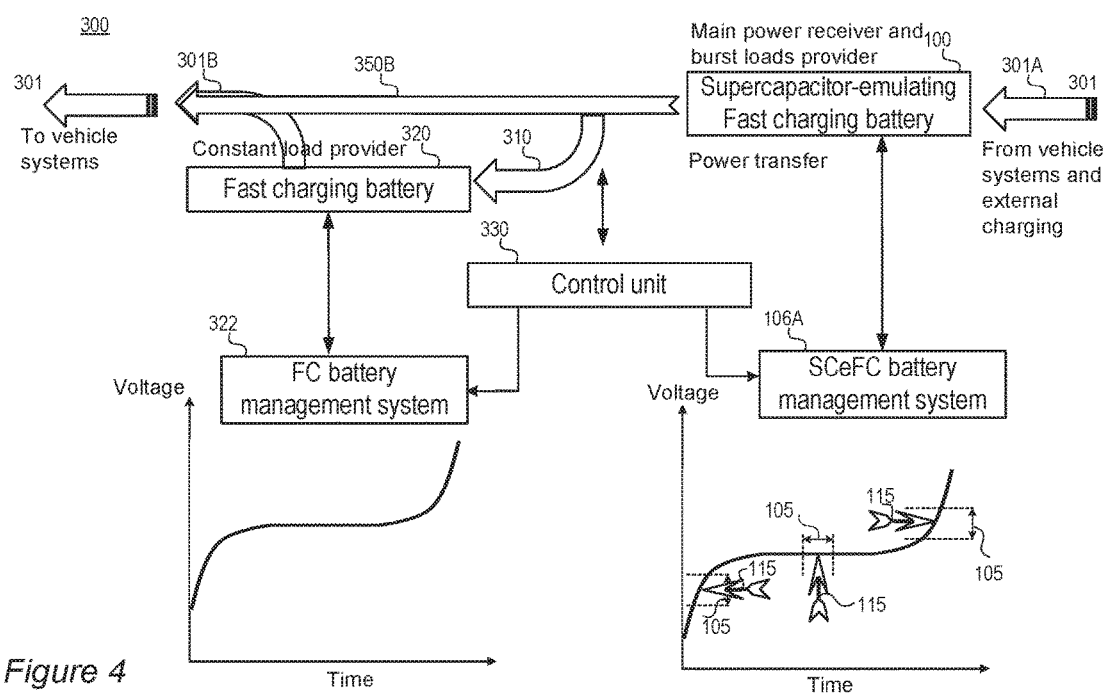
FIG. 4 is a high level schematic illustration of the power train of the electric vehicle, according to some embodiments of the invention.

FIG. 4 is a high level schematic illustration of power train 300 of electric vehicle 301, according to some embodiments of the invention. Power train 300 of electric vehicle 301 may comprise FC 320 as constant load power provider, configured to deliver power 301B to electric vehicle 301, particularly when under prolonger load, and SCeFC 100, configured to receive recuperated power 301A from electric vehicle 301, which typically arrives in bursts, and also to deliver burst power loads 350B to electric vehicle 301. Recuperated energy charged into SCeFC 100 beyond power requirements may be used to charge FC 320.

In general, in embodiments corresponding to such scenario (see also FIGS. 5A-5C below), power train 300 is configured to allocate SCeFC 100 to handle bursts, thereby making use of its long cycle lifetime achieved as disclosed above, while minimizing cycling of FC 320 to increase the overall lifetime of power train 300.

Both FC 320 and SCeFC 100 may have anodes 108 with Si, Ge, Sn and/or LTO-based anode active material 110 (and/or 110A, 110B, 110C, see FIGS. 9A, 9B below), possibly providing power train 300 based on the same type of anode material.

SCeFC 100 may be configured to operate at 5 C at least and within operation range 105 of 5% at most around working point 115 of between 60-80% lithiation of the anode active material, which may comprise Si, Ge, Sn and/or LTO-based anode active material 110 (and/or 110A, 110B, 110C).

Power train 300 may further comprise control unit 330 configured to maintain a state of charge (SoC) of SCeFC 100 within operation range 105 around working point 115, manage FC 320 and SCeFC 100 with respect to power delivery to and from vehicle 301, denoted schematically 301B and 301A respectively, and manage power delivery 310 from SCeFC 100 to FC 320 according to specified criteria that minimize the cycling and possibly DoD of FC 320. For example, FC 320 may be associated with FC battery management system (FC BMS) 322 and SCeFC 100 may be associated with SCeFC battery management system (SCeFC BMS) 106A, possibly comprising control circuitry 106.

Advantageously, SCeFC 100 may be configured to receive energy bursts and deliver required energy bursts, which are irregular in extent and timing, to reduce cycling of FC 320. As SCeFC 100 may be configured to be operable over a very large number of cycles (e.g., 10,000's cycles, as explained and demonstrated above), SCeFC 100 can withstand the erratic energy inputs 301A without reduction of the cycle lifetime of power train 300. Moreover, as the actual capacity of SCeFC 100 is much higher than its operation range 105, it may also be used to receive peaks of power 301A and thereby increase the extent and efficiency of energy recuperation, as exemplified in Table 3 above. The combination of FC 320 and SCeFC 100 in disclosed embodiments may therefore extend the cycle lifetime of power train 300 beyond the cycle lifetime of FC 320 (as SCeFC 100 buffers much of the cycling), for example two-fold, three-fold or even ten-fold. e.g., from hundreds of cycles for FC 320 to thousands of cycles for power train 300 (or, in various embodiments, from 300-500 cycles for FC 320 to 600-2000 cycles for power train 300). Alternatively or complementarily, power train 300 may provide increased capacity and/or larger recuperation extent and efficiency than FC 320 operated by itself. Alternatively or complementarily, power train 300 may improve cost and/or size parameters, as explained in the examples above for SCeFC 100 alone and as illustrated for power train 300 in Table 3 above.

Figure 5A:
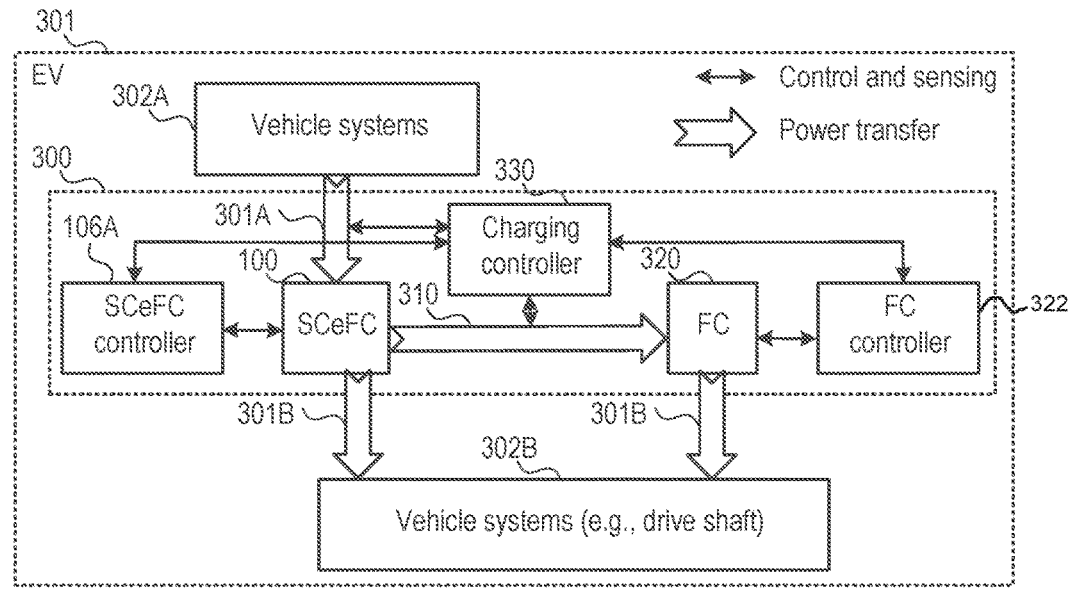
FIGS. 5A-5C are high level schematic illustration of system configurations, operation algorithms and examples of power trains of electric vehicles, according to some embodiments of the invention.
Figure 5B:
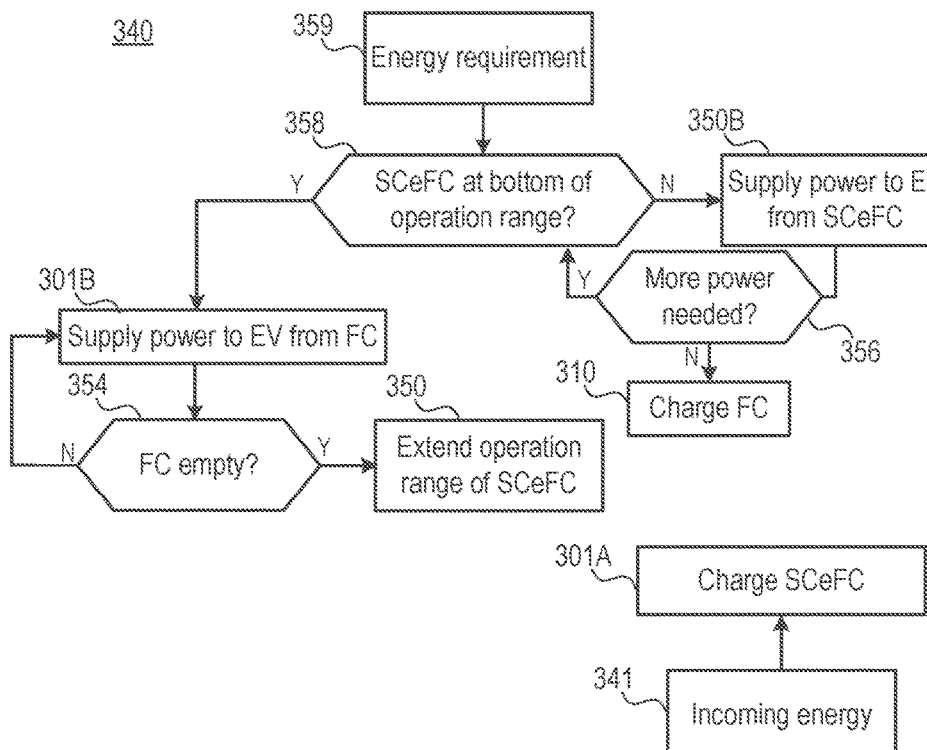
Figure 5C:
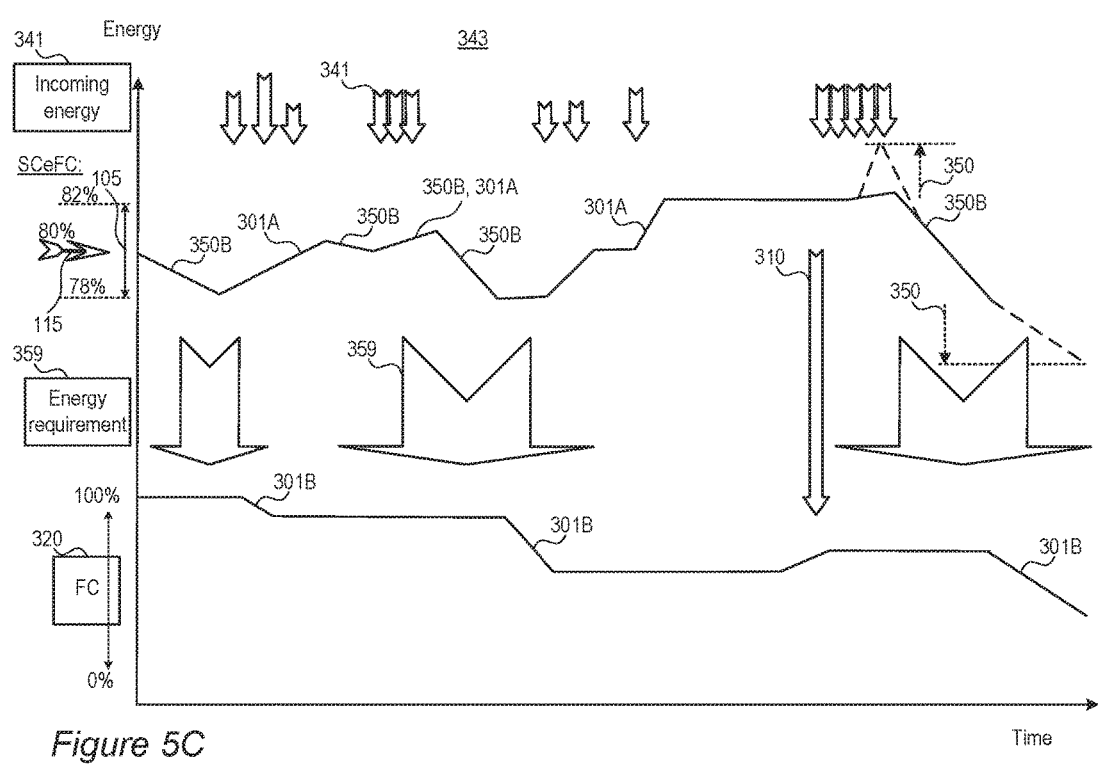

FIGS. 5A-5C are high level schematic illustration of system configurations, operation algorithms 340 and examples 343 of power train 300 of electric vehicle 301, according to some embodiments of the invention.

FIG. 5A illustrates schematically power train 300 in vehicle 301, according to some embodiments of the invention. Vehicles systems 302A such as brakes are illustrated as power providers while vehicles systems 302B such as the drive shaft are illustrated as power consumers, without loss of generality. Power transfer to vehicles systems 302B may be carried out from SCeFC 100 (power 301B) and as long as it has available power, which is received from stored recuperated power bursts received (301A) from vehicles systems 302A. FC 320 may be configured to provide constant power 301B when needed, while SCeFC 100 may be used to minimize the DoD of FC 320. FC 320 may be provided with power 310 from SCeFC 100, when SCeFC 100 can provide energy beyond the burst requirement of vehicle 301. Charging controller 330 may be configured to control each of power transfers 301A, 310, 301B directly and/or through corresponding SCeFC controller 106A and FC controller 322. Charging controller 330, SCeFC controller 106A and FC controller 322 may comprise or be part of control unit 330, SCeFC BMS 106A and FC BMS 322 illustrated in FIG. 4. It is noted that, in any of the embodiments, the terms controller and BMS may be used alternately, or may represent hierarchically arranged unit, possibly partly or fully integrated in control unit 330.

FIG. 5B illustrates schematically a high-level operation scheme 340 of power train 300 in vehicle 301, according to some embodiments of the invention. Energy requirements 359, e.g., energy consumed by vehicle systems 301, may be first provided (350B) by SCeFC 100, if SCeFC 100 is above the bottom of operation range 105 (see 358). Otherwise, e.g., if SCeFC is drained (see 356, 358)—FC 320 may be used to provide power to vehicle 301 (301B), particularly during constant loads. Alternatively, if extra power is left in SCeFC 100 which is not provided to vehicle 301, FC 320 may be charged from SCeFC 100 (see 310). Once FC 320 is empty (see 354), exceptional case 350 of extending operation range 105 may be applied, e.g., as emergency mode explained below. Incoming energy 341, e.g., energy received from vehicle systems 301 and/or from charging stations, may be delivered to and be stored in SCeFC 100 (as power transfer 301A) and delivered therefrom directly to vehicle 301 and/or to FC 320. It is noted that working point 115 and operation range 105 SCeFC 100 may be configured to comply with certain expected amounts of incoming energy 341 and/or certain maximal energy recuperation criteria, which may significantly affect the overall energy efficiency of vehicle 301. FIG. 6A below and related embodiments address processes for determining these parameters.

FIG. 5C is a high-level schematic non-limiting qualitative example 343, according to some embodiments of the invention, for operation of power train 300 in an arbitrary scenario of power supply such as bursts of incoming energy 341 (e.g., recuperated energy and/or, alternatively or complementarily, bursts of charged energy from a charging station) indicated by arrows at the top part of the diagram, and power requirements 359, indicated schematically by the thick arrows at the bottom part of the diagram, and similar to FIG. 3C. In an operation scheme along the principles outlined in FIGS. 4, 5A and 5B, SCeFC 100 is operated as receiver of energy bursts 341 and provider of energy 350B to satisfy the vehicle's energy requirements 359, to reduce the DoD and the number of chargings 310 of FC 320. It is noted that the tradeoff between the number of charging and discharging cycles of FC 320 and the DoD of FC 320 may be optimized to maximize its overall lifetime (see e.g., FIG. 6A). FC 320 supplies typically larger and constant power demands (301B) to deliver required energy 359, and is charged by SCeFC 100 when energy therefrom is available. Exceptional scenario 350 (illustrated schematically at the righthand side of the diagram, in either direction—above the maximal SoC to receive more regenerated energy, or below the minimal SoC to provide additional power, e.g., if FC 320 is drained, not shown) may be required as emergency scenario, e.g., in case FC 320 is unavailable, possibly in repair mode of FC 320, for exceptional range extension requirements, or possibly for enhanced recuperation under certain circumstances, as explained below. In the illustrated example, SCeFC 100 is shown to be operated at ±2% operation range 105 around 80% lithiation as working point 115, without loss of generality. It is noted that SCeFC 100 is generally operated with a much higher charging and discharging C rate than FC 320, using its high cyclability.

It is noted that in both FIGS. 3C and 5C, the slopes of charging and discharging SCeFC 100 are steeper than the slopes of charging and discharging FC 320, due to the higher maximal charging and discharging rates (C rate) achievable by the configuration of SCeFC 100 to have higher C rate than FC 320, as described above. As non-limiting examples, FC 320 may be operable at least at a maximal C rate (charging/discharging current to capacity ratio) of any of 1 C, 2 C, 5 C, 10 C, while SCeFC 100 may be configured to be operable at least at a maximal C rate of any of 5 C, 10 C, 20 C, 30 C, respectively, or even at higher maximal C rates of e.g., 50 C, 100 C or higher, depending on the configuration parameters of SCeFC 100, as explained above.

FIG. 6A illustrates schematically a high-level flowchart of an algorithm 360 for optimizing module sizes 368 of FC 320 and SCeFC 100 of power train 300 in vehicle 301, according to some embodiments of the invention. For example, predefined required recuperation energy criteria 361, parameters of expected charge/discharge profiles (e.g., expected burst or pulse frequency) and energy per cycles criteria 362 may be used to characterize expected charging/discharging cycles 365 for each of FC 320 and SCeFC 100 according to various operation schemes 340 and scenarios 343. Then, resulting SoC profiles 367 from expected charging/discharging cycles 365 may be used, together with parameters 362 presented above, to calculate SCeFC and FC module sizes 368, as well as working point 115 and operation range 105 for SCeFC 100. For example, a non-limiting calculation based on a required recuperation ability 361 of 60 kWh pack during 8 hours and charge/discharge profile (pulse frequency) 362 of ca. 1.5 minutes or 0.2 kWh per each charge/discharge cycle results in required cycle number 365 of 300 charge/discharge cycles (60 kWh divided by 0.2 kWh) and predefined SoC 367 of 1%. These parameters correspond to SCeFC module 100 of 20 kWh (which then provides 0.2 kWh at 1% SoC). Further consideration of constant load requirements of vehicle 301 may further provide the required FC module size.

Figure 6B:
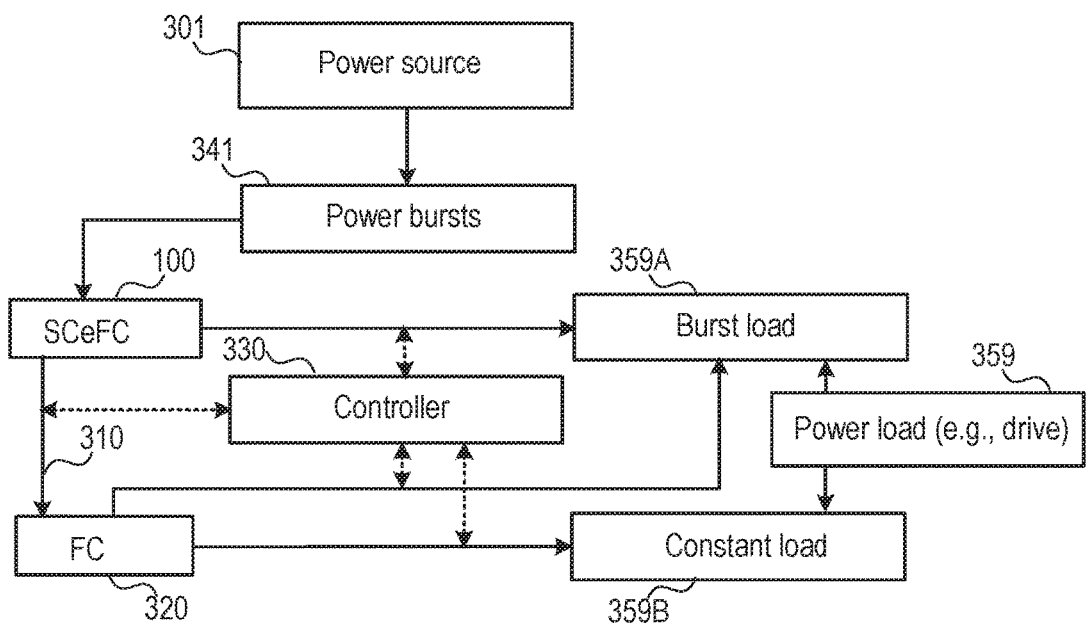
FIG. 6B is a high level schematic illustration of power trains and operation modes thereof, according to some embodiments of the invention.

FIG. 6B is a high level schematic illustration of power train 300 and operation modes thereof, according to some embodiments of the invention. Illustrated power train 300 is configured to receive energy burst by SCeFC 100 and provide power to burst loads 359A by SCeFC 100, and to deliver power to constant loads 359B by FC 320, with SCeFC 100 is also configured to charge 310 FC 320, with all energy transfers controlled by control unit 330.

In certain embodiments, SCeFC 100 may be configured to have a similar lifetime as FC 320, by being operated at higher frequency (more cycles) utilizing its capacity to support a large number of cycles. The high charging rate of SCeFC 100 is utilized to capture energy from regenerative braking, and the capacity of SCeFC 100 may be configured to support operation range 105 which enables to accept most or even all of the recovered energy.

In certain embodiments, SCeFC 100 may be configured to have a voltage level which is above a minimum cranking voltage during engine start—to enable starting the engine by SCeFC 100, providing corresponding burst load 359A. SCeFC 100 may be configured to accepts high currents for short periods of time during regenerative breaking, and be partly charged up to predefined SoC. SCeFC 100 may be configured to supply loads when the engine is off, and possibly support engine starts and stops, while FC 320 may be configured to provide constant loads 359B during longer periods. Controller 330 may be configured to allocate SCeFC 100 and/or FC 320 according to required loads 359 and set corresponding priorities. Controller 330 may be further configured to regulate the charging and discharging currents to all components (together or separately) with the defined priorities.

In certain embodiments, SCeFC 100 may be operated in emergency mode (e.g., for extending range) and be charged 350 over predefined SoC (beyond predefined operation range 105, if possible) to provide additional energy to extend the range of vehicle 301, e.g., in emergency cases. For example, in a 80 kWh FC 320 and 20 kWh SCeFC 100 (see e.g., the fifth column in Table 3 above), additional 20 kWh provided by SCeFC (either from grid charging and/or by extending operation range 105) may increase the total energy of power train 300 and the maximal range by 20% (or 25% with respect to FC 320 alone).

In certain embodiments, part of the capacity of SCeFC 100 may be used to compensate for capacity loss of FC 320, as illustrated schematically in Table 4 in a non-limiting example. In repair mode use, SCeFC module 100 may be partially used as repair battery for FC module 320 to extend the overall cycle life.

TABLE 4

An example for repair mode operation

|  | Two batteries (hybrid) - FC and SC-emulating FC | | Repair mode Two batteries (hybrid) - FC and SC-emulating FC | |
| --- | --- | --- | --- | --- |
| Battery Pack | 80 kWh | 20 kWh | 80 kWh | 20 kWh |
| % of Recuperation | 0% | 300% | 0% | 300% |
| Recuperation Energy |  | 60 kWh |  | 60 kWh |
| Damaged Cell | 10 kWh | — | 10 kWh | — |
| Final Battery Pack | 70 kWh | 20 kWh | 80 kWh | 10 kWh |
| % SOC used | 100 | 1 | 100 | 2 |
| Total Energy | 138 kWh | | 140 kWh | |
| Driving time | 7 hours | | 8 hours | |
| Average Energy Consumption | 17.5 kWh per hour | | 17.5 kWh per hour | |
| Average Recuperation | 8 kWh per hour | | 8 kWh per hour | |
| Range | ~260 km | | 300 km | |

The left-hand column illustrates schematically FC 320 with damaged capacity (capacity loss equivalent to 10 kWh). The righthand column illustrates schematically the re-configuration of SCeFC 100 to compensate for the damage of FC 320, by allocating certain capacity (equivalent in the non-limiting illustrated case to 10 kWh) to be operated similarly to FC module 320. Advantageously, as FC 320 and SCeFC 100 are based on similar anode and cathode material, the conversion of available capacity is straightforward. Operation range 105 of SCeFC 100, and possibly working point 115 thereof as well, may be adjusted to optimize operation of power train 300, e.g., operation range 105 may be extended to compensate at least partly for the reduced capacity of SCeFC allocated to receive (and possibly provide) bursts of energy.

Figure 7A:
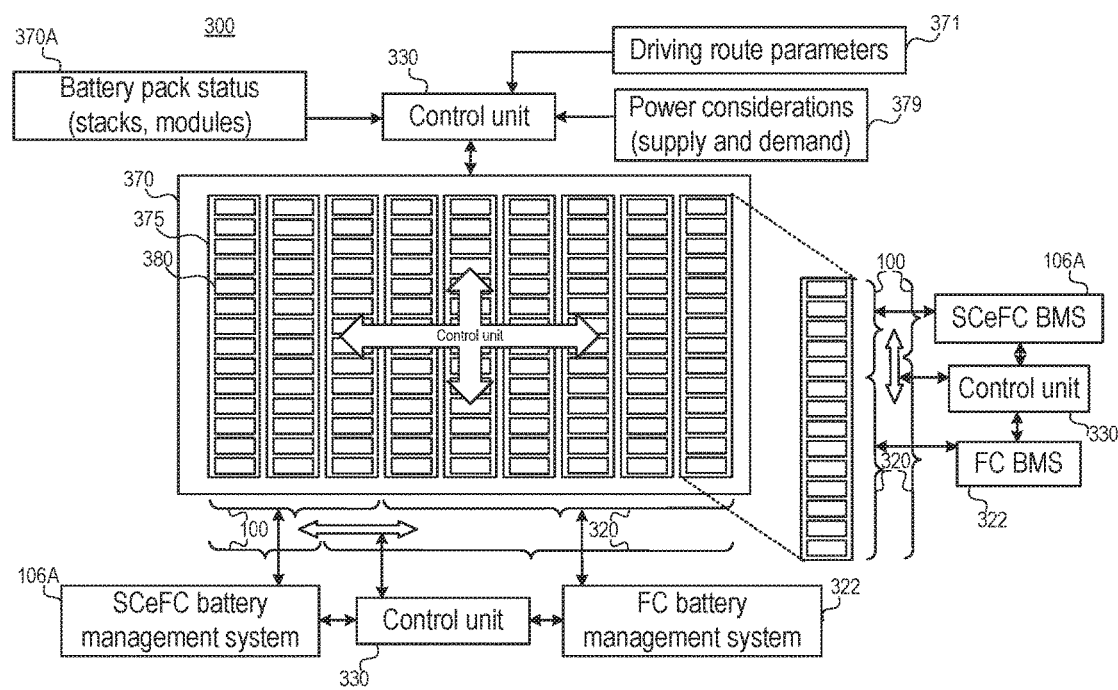
FIG. 7A is a high level schematic illustration of power trains having FC and SCeFC modules, respectively, implemented in a single battery, according to some embodiments of the invention.

FIG. 7A is a high level schematic illustration of power train 300 having FC and SCeFC modules 320, 100, respectively, implemented in a single battery 370, according to some embodiments of the invention. Battery 370 may comprise multiple internal modules 375, each with multiple cell stacks 380. Control unit 330 may be configured to manage an allocation of multiple internal modules 375 or even of cell stacks 380 to FC and SCeFC modules 320, 100, respectively. It is noted that allocation and management refer to operating different internal modules 375 and/or cell stacks 380 according to different operation profiles and conditions, as characterized by FC and SCeFC modules 320, 100 disclosed herein.

As illustrated schematically in FIG. 7A, internal modules 375 and/or cell stacks 380 may be allocated as belonging to FC and SCeFC modules 320, 100, respectively, as indicated schematically by the illustrated brackets, with each of FC and SCeFC modules 320, 100 controlled by respective FC BMS 322 and SCeFC BMS 106A. Control unit 330 may be configured to control FC BMS 322 and SCeFC BMS 106A and power receipt and delivery profiles, as explained herein, as well as change the allocation of internal modules 375 and/or cell stacks 380 (illustrated schematically by the crossed double headed arrows) between FC and SCeFC modules 320, 100, respectively, according to exceptional operation requirements (e.g., damage to some of cell stacks 380, range extension requirement 350 etc.). Control unit 330 may be further configured to control allocation to FC and SCeFC modules 320, 100, respectively, with respect to battery pack status parameters 370A (e.g., relating to efficiency and operation of internal modules 375 and/or cell stacks 380), driving route parameters 371 and related power considerations 379 (e.g., extended up-hill or down-hill driving sections with corresponding extended power requirements or extend power recuperation potential, respectively, distribution of charging stations along the route, expected power requirements associated with changing parameters such as weather, etc.). Re-allocation of internal modules 375 and/or cell stacks 380 between FC and SCeFC modules 320, 100, respectively, may be carried out by control unit 330 as exception (e.g., in repair or emergency modes) or as regular adjustment of power train 300 to changing conditions.

In certain embodiments, control unit 330 may be further configured to manage allocation of elements of the single battery to FC 320 and SCeFC 100 and optionally to re-allocate elements of the single battery between FC 320 and SCeFC 100 according to operation parameters of the elements, and/or possibly to implement repair mode (compensation for damage to FC 320 by SCeFC 100), range extension mode (addition of capacity to FC 320 from SCeFC 100) etc., as disclosed above. In such embodiments control unit 330 may be configured to take over the respective BMSs of FC 320 and SCeFC 100 to form a single controller of the battery.

In certain embodiments, FC 320 and SCeFC 100 may be implemented in at least two corresponding separate batteries, managed by control unit 330 as disclosed above.

Figure 7B:
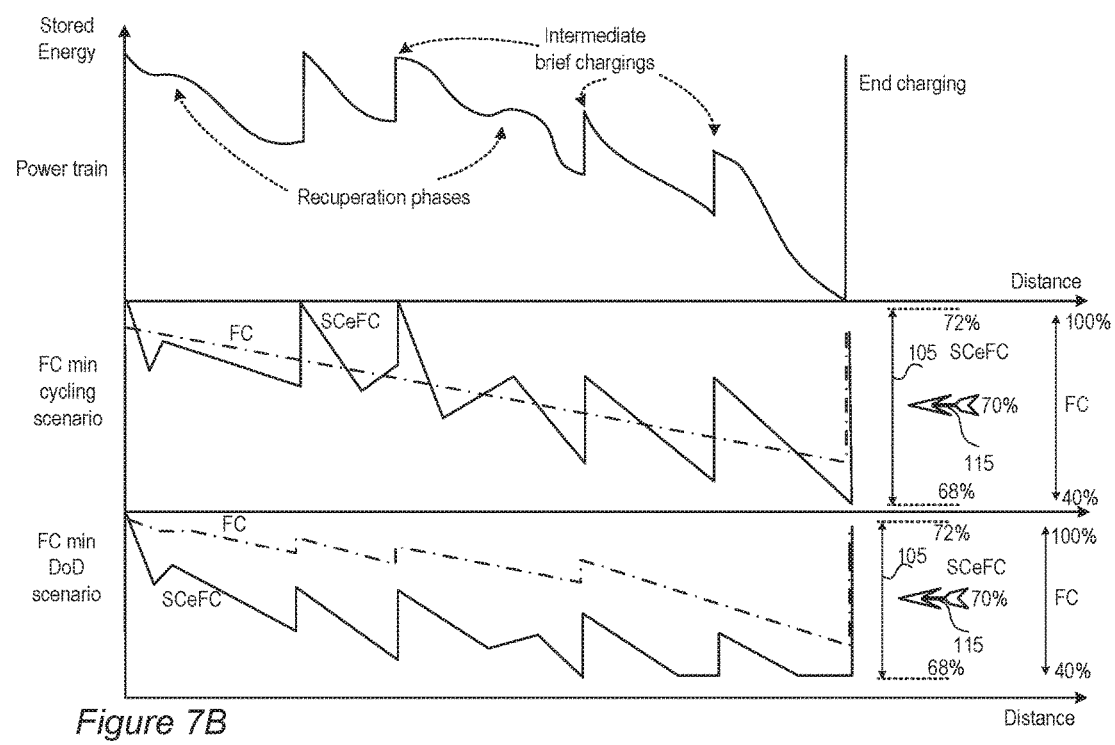
FIG. 7B is an illustration of highly schematic power supply profiles, according to some embodiments of the invention.

FIG. 7B is an illustration of highly schematic power supply profiles, according to some embodiments of the invention. The illustration is non-limiting and schematic, and relates in a general manner a power profile of the EV along a drive, reflecting the changes in stored energy in power train 300 along the driven distance (top graph) and two scenarios for splitting the power profile of power train 300 between FC 320 and SCeFC 100, using different considerations as guiding principles (two bottom graphs, showing FC and SCeFC stored energy separately and schematically). It is emphasized that control unit 330 may be configured to implement any splitting scenario between FC 320 and SCeFC 100 as well as to switch between scenarios during operation, according to various considerations (e.g., battery pack(s) status parameters 370A, driving route parameters 371, power considerations 379 etc.).

In the illustrated example (top graph), the general downwards trend of the stored energy reflects energy use by the EV, with intermittent brief charging periods, e.g., at charging stations. The slope of the energy use profile depends on energy demands of the EV (depending on the driving route and supplemental needs of the EV) and changes along the travelled distance, with intermittent periods of power recuperation which make the slope milder or even reverse the power profile into net power regeneration occasionally.

Allocation of SCeFC 100 and FC 320 to power supply and power receipt may be carried out in various scenarios, of which two are presented—a first scenario (middle graph) in which FC 320 is operated continuously at a constant slope to minimize its cycling, with power fluctuations (resulting from charging, recuperation and high demand, illustrated schematically) buffered by SCeFC 100; and a second scenario (bottom graph) in which FC 320 is operated to minimize its DoD and is periodically charged, while SCeFC 100 is operated as much as necessary to minimize the need to drain power from FC 320. Corresponding to these scenarios, schematic fluctuations in energy stored in SCeFC 100 and FC 320 are illustrated to represent schematically power supply and demand allocation form either source by control unit 330. Clearly in various implementations details may be modified. In the illustrated example, SCeFC 100 is shown to be operated at ±2% operation range 105 around 70% lithiation as working point 115, without loss of generality. It is noted that both scenarios, SCeFC 100 handles most power (provision and receipt) bursts, using its high cyclability, and is characterized by a much higher charging and discharging C rate.

Figure 7C:
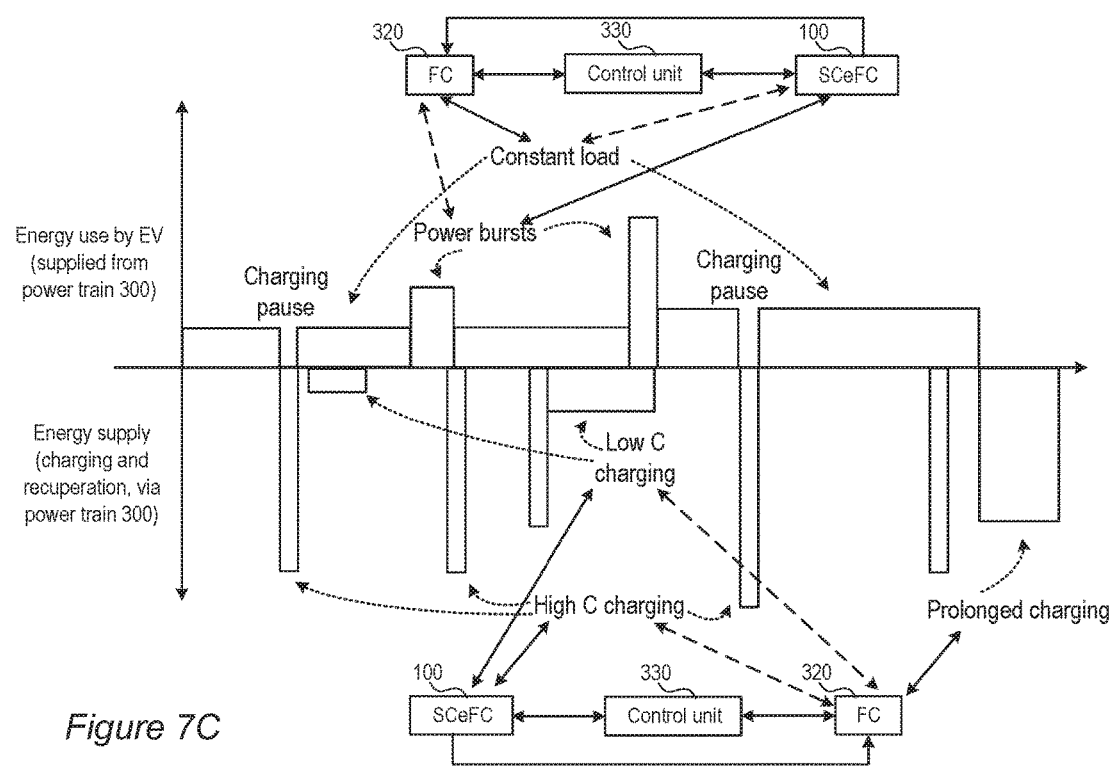
FIG. 7C is a conceptual high-level illustration of power supply and demand allocation by controls between the SCeFC and the FC, according to some embodiments of the invention.

FIG. 7C is a conceptual high-level illustration of power supply and demand allocation by control unit 330 between SCeFC 100 and FC 320, according to some embodiments of the invention. Energy use by the EV, supplied from power train 300, is typically characterized by relatively constant load periods, which require quite constant power supply of large energy amounts, and power burst periods, which require smaller amounts of energy but at higher discharging rates (bursts). Control unit 330 may be configured to optimize the use of FC 320 and SCeFC 100 with respect to their typical C rates and cyclability, e.g., allocate FC 320 to provide constant loads and allocate SCeFC 100 to provide burst power on top of the constant load. Alternatively or complementarily, SCeFC 100 may be configured to provide as much power as available from it, with FC 320 being used mainly when SCeFC is exhausted. Energy supply to power train 300 typically comprises charging power bursts, e.g., in brief stops for charging, which require high C rate charging, and possibly low C charging periods of energy recuperation (e.g., on down-hill drives, and upon operation of brakes).

Control unit 330 may be configured to receive power primarily by SCeFC 100, to reduce cycling of FC 320, and/or to partly charge FC 320 to reduce its DoD. Both SCeFC 100 and FC 320 may be charged during prolonged charging periods, e.g., following a drive, at night, etc. The allocation of charged energy to SCeFC 100 and FC 320 may be controlled by control unit 330 with respect to various parameters, including the state of the battery pack(s) and required power storage for future parts of the driving route, including possibly re-allocation of battery modules between SCeFC 100 and FC 320 (see e.g., FIG. 7A).

In certain embodiments, SCeFC 100 and FC 320 may interface with the EV along lines disclosed in U.S. application Ser. No. 15/678,143, namely with SCeFC 100 configured to be charged and discharge via existing EV power connections, without requirement for higher power electronics, e.g., upon configuration of SCeFC to receive and provide limited amounts of energy which correspond to specifications of the given EV power electronics. In other embodiments however, the power provision circuitry may be configured to support high power transfer to enhance the benefits of using SCeFC 100 and to enhance power recuperation.

FIG. 8 is a high level schematic flowchart illustrating a method of emulating a supercapacitor by a fast-charging battery and using the emulated supercapacitor in the power train of the electric vehicle, according to some embodiments of the invention. Method 200, as illustrated schematically in FIG. 8, may comprise emulating a supercapacitor with given specifications by a fast-charging battery (stage 205), e.g., to yield SCeFC 100, by configuring the fast-charging battery to emulate the supercapacitor with respect to specified requirements (stage 210), for example by configuring physical dimensions of the battery to provide the required specifications (stage 220), determining charging/discharging rate of the battery (stage 225) and/or determining the working point and the partial operation range of the battery (stage 230). Method 200 may further comprise configuring the control circuitry of the battery to provide the required performance (stage 240).

Method 200 may further comprise selecting the working point within an optimal operation window (stage 250), possibly selecting the working point as a highly lithiated point within the optimal operation window to reduce relative expansion of the anode material particles during operation (stage 255).

Method 200 may further comprise modifying the battery to further enhance its performance within the operation range (stage 260), e.g., by optimizing the anode configuration under assumption of operation only around the working point and within the operation range (stage 265)—see e.g., FIG. 6, and FIG. 9B below.

Method 200 may further comprise configuring a power train for an electric vehicle from a main fast-charging lithium ion battery module (FC), configured to deliver power to the electric vehicle, and a supercapacitor-emulating fast-charging lithium ion battery module (SCeFC), configured to receive power (e.g., charged into the power train and/or recuperated from the EV) and to deliver power to the FC (stage 400), wherein both the FC and the SCeFC have anodes with the same anode active material (e.g., Si, Ge and/or Sn-based anode active material, LTO-based anode material etc.) and wherein the SCeFC is configured to operate at least at a maximal charging rate of 5 C and within an operation range of 5% at most around a working point of between 60-80% lithiation of the anode active material. Method 200 may further comprise operating the SCeFC battery to receive recuperated power from the electric vehicle and deliver power to the FC and operating the FC to deliver power to the electric vehicle (stage 410).

In certain embodiments, method 200 may comprise any of maintaining the state of charge (SoC) of the SCeFC within the operation range around the working point (stage 420), managing the FC and the SCeFC with respect to power delivery to and from the electric vehicle, respectively (stage 430), and managing power delivery from the SCeFC to the FC according to specified criteria that minimize the depth of discharge (DoD) of the FC (stage 440).

In certain embodiments, method 200 may further comprise allocating at least a part of the SCeFC to complement operation of the FC when the FC experiences reduced capacity (stage 450), wherein the allocation is carried out by increasing the operation range of the SCeFC (stage 455), and possibly extending the operation range of the SCeFC in exceptional situations to compensate for power drainage and/or damage to the FC. In certain embodiments, method 200 may further comprise configuring the SCeFC to deliver power bursts to power to the electric vehicle, to minimize the DoD of the FC (stage 460). Method 200 may further comprise minimizing the operation range of the SCeFC and maximizing cycling of the SCeFC with respect to the cycling of the FC (stage 465).

It is noted that the control unit may be further configured to minimize a depth of discharge (DoD) of the FC and/or to minimize a number of cycles of the FC. Method 200 may be implemented on battery modules which may be based on any of Si, Ge, Sn and/or LTO.

In certain embodiments, method 200 may further comprise operating the SCeFC as main burst receiver (e.g., high C charged power, recuperated energy etc.) and main burst provider (e.g., supplying required power bursts at high C rate) and operating the FC as main constant load supplier (stage 470). Method 200 may further comprise managing power supply from the SCeFC and the FC with respect to load characteristics such as load constancy and burst parameters (stage 475).

Method 200 may further comprise implementing the FC and the SCeFC in a single battery (stage 480) and/or managing internal modules and cell stacks with respect to their allocation to the FC and the SCeFC (stage 485) and/or possibly re-allocating internal modules and cell stacks to the FC and the SCeFC (stage 490), according to performance requirements such as driving route parameters, power considerations, operation parameters of the battery elements etc.

In certain embodiments, method 200 may further comprise implementing the FC and SCeFC in at least two corresponding separate batteries.

In certain embodiments, anode configuration optimization 265 may further comprise configuring the anode active material to enable operation of the SCeFC only around the working point and within the operation range and/or possibly selecting the working point within an optimal operation window of the SCeFC as a highly lithiated point to reduce relative expansion of anode material particles during operation—all with respect to operating SCeFC in power train 300 of the electric vehicle.

Any part(s) of method 200 may be implemented in computer program product(s) which may be incorporated in any of power train control unit 330 and/or in BMSs 322 and/or 106A.

Certain embodiments comprise a computer program product comprising a non-transitory computer readable storage medium having computer readable program embodied therewith, the computer readable program configured to operate a SCeFC battery to receive recuperated power from an electric vehicle and deliver power to a FC and operate the FC to deliver power to the electric vehicle, wherein a power train of the electric vehicle comprises the FC as main power supplier and the SCeFC as main power receiver, both the FC and the SCeFC have anodes with Si, Ge, Sn and/or LTO-based anode active material, and wherein the SCeFC is configured to operate at 5 C at least and within an operation range of 5% at most around a working point of between 60-80% lithiation of the anode material, which may comprise Si, Ge, Sn and/or LTO-based anode active material. The computer program product may further comprise computer readable program configured to operate the SCeFC at 5 C at least and within an operation range of 5% at most around a working point of between 60-80% lithiation of the anode active material.

In certain embodiments, the computer program product may further comprise computer readable program configured to maintain a state of charge (SoC) of the SCeFC within the operation range around the working point, manage the FC and the SCeFC with respect to power delivery to and from the electric vehicle, respectively, and manage power delivery from the SCeFC to the FC according to specified criteria that minimize a depth of discharge of the FC.

In certain embodiments, the computer program product may further comprise computer readable program configured to allocate at least a part of the SCeFC to complement operation of the FC when the FC experiences reduced capacity, wherein the allocation is carried out by increasing the operation range of the SCeFC. In certain embodiments, the computer program product may further comprise computer readable program configured to select the working point within an optimal operation window of the SCeFC as a highly lithiated point to reduce relative expansion of anode material particles during operation.

Certain embodiments comprise computer program product comprising a non-transitory computer readable storage medium having computer readable program embodied therewith, the computer readable program configured to operate a power train of an electric vehicle (EV), the power train comprising a main fast-charging lithium ion module (FC), configured to deliver power to the EV, and a supercapacitor-emulating fast-charging lithium ion module (SCeFC), configured to receive power and to deliver power to the EV and/or to the FC, wherein both the FC and the SCeFC have anodes based on a same anode active material, and wherein the SCeFC is configured to operate at least at a maximal charging rate of 5 C and within an operation range of 5% at most around a working point of between 60-80% lithiation of the anode active material, wherein the computer readable program comprises: computer readable program configured to operate the SCeFC battery to maintain a state of charge (SoC) of the SCeFC within the operation range around the working point, computer readable program configured to manage the FC and the SCeFC with respect to power delivery to and from the EV, respectively, and computer readable program configured to manage power delivery from the SCeFC to the FC and/or to the EV according to specified criteria. Implementation of any of the computer readable programs may be configured according to the principles, scenarios and control configurations disclosed herein.

Modified fast-charging batteries 100A may comprise improved anodes and cells, which enable fast charging rates with enhanced safety due to much reduced probability of metallization of lithium on the anode, preventing dendrite growth and related risks of fire or explosion. Anodes and/or electrolytes may have buffering zones for partly reducing and gradually introducing lithium ions into the anode for lithiation, to prevent lithium ion accumulation at the anode electrolyte interface and consequent metallization and dendrite growth. Various anode active materials and combinations, modifications through nanoparticles and a range of coatings which implement the improved anodes are provided. The electrolyte in the cell may be chosen to further reduce the accumulation rate of lithium ions at the interface, while maintaining the lithiation in the anode material is the rate limiting factor.

Figure 9A:
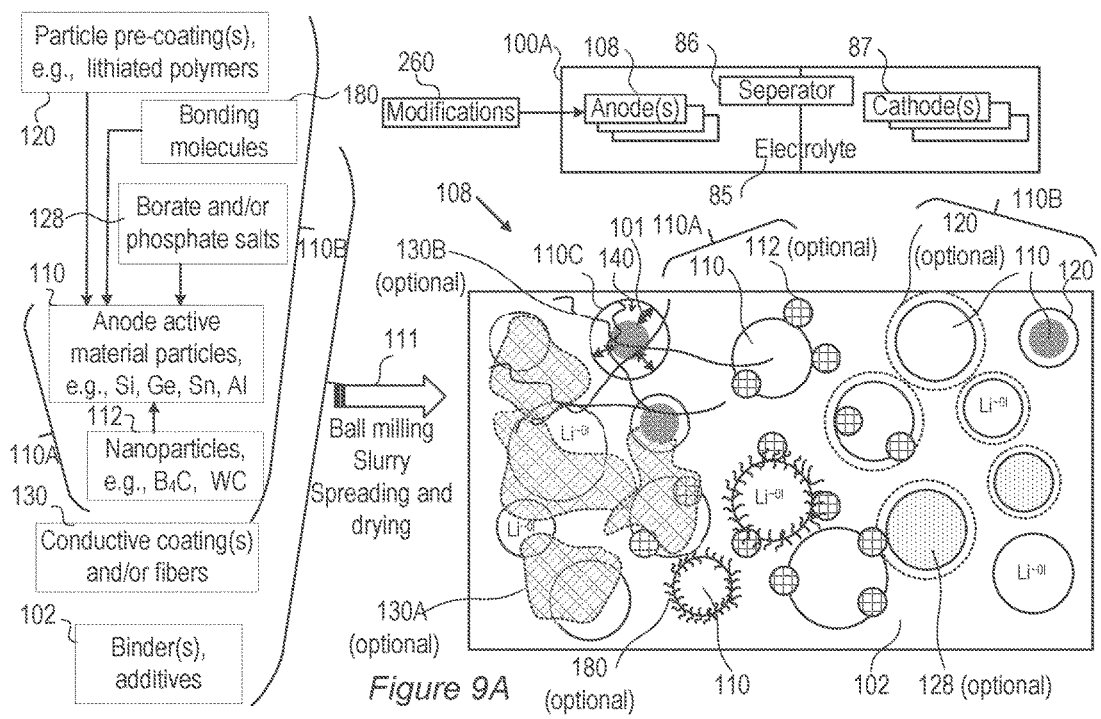
FIG. 9A is a high level schematic illustration of various anode configurations, according to some embodiments of the invention.

FIG. 9A is a high level schematic illustration of various anode configurations, according to some embodiments of the invention. FIG. 9A illustrates schematically, in a non-limiting manner, a surface of anode 108, which may comprise anode active material particles 110 (e.g., particles of metalloids such as silicon, germanium and/or tin, and/or of aluminum), and/or possibly composite core-shell particles 110B, at different sizes (e.g., in the order of magnitude of 100 nm, e.g., 100-500 nm, and/or possible in the order of magnitude of 10 nm or 1μ)—for receiving lithiated lithium during charging and releasing lithium ions during discharging. Anodes 108 may further comprise binder(s) and additive(s) 102 as well as optionally coatings 130 (e.g., conductive polymers 130A with or without lithium, conductive fibers 130B such as CNTs (carbon nanotubes) or carbon fibers). Active material particles 110 may be pre-coated by one or more coatings 120 (e.g., by conductive polymers, lithium polymers, etc.), have borate and/or phosphate salt(s) 128 bond to their surface (possibly forming e.g., $B_2O_3$, $P_2O_5$), bonding molecules 180 (illustrated schematically) which may interact with electrolyte 85 (and/or ionic liquid additives thereto) and/or various nanoparticles 112 (e.g., $B_4C$, WC, VC, TiN) (forming modified anode active material particles 110A), may be attached thereto in anode preparation processes 111 such as ball milling (see, e.g., U.S. Pat. No. 9,406,927, which is incorporated herein by reference in its entirety), slurry formation, spreading of the slurry and drying the spread slurry. For example, anode preparation processes 111 may comprise mixing additive(s) 102 such as e.g., binder(s) (e.g., polyvinylidene fluoride, PVDF, styrene butadiene rubber, SBR, or any other binder), plasticizer(s) and/or conductive filler(s) with a solvent such as water or organic solvent(s) (in which the anode materials have limited solubility) to make an anode slurry which is then dried, consolidated and is positioned in contact with a current collector (e.g., a metal, such as aluminum or copper). Details for some of these possible configurations are disclosed below.

In certain embodiments, modified fast-charging batteries 100A may be optimized for operation in device 100 by application of modifications 260 with respect to fast-charging batteries which are operated over their full (nominal) operation range. For example, battery 100A may be modified (260) to further enhance its performance within the operation range, e.g., by optimizing the anode configuration under assumption of operation only around the working point and within the operation range. For example, the anode material particles may be larger and/or more densely distributed in anodes 108 configured to operate only around the working point and within the operation range.

It is explicitly noted that in certain embodiments, cathodes may be prepared according to disclosed embodiments, and the use of the term anode is not limiting the scope of the invention. Any mention of the term anode may be replaced in some embodiments with the terms electrode and/or cathode, and corresponding cell elements may be provided in certain embodiments. For example, in cells 100A (of modified fast-charging batteries 100A, both designated by numerals 100A without limiting the scope of the invention to either) configured to provide both fast charging and fast discharging, one or both electrodes 108, 87 may be prepared according to embodiments of the disclosed invention.

Anode material particles 110, 110A, 110B, anodes 108 and cells 100A may be configured according to the disclosed principles to enable high charging and/or discharging rates (C-rate), ranging from 3-10 C-rate, 10-100 C-rate or even above 100 C, e.g., 5 C, 10 C, 15 C, 30 C or more. It is noted that the term C-rate is a measure of the rate of charging and/or discharging of cell/battery capacity, e.g., with 1 C denoting charging and/or discharging the cell in an hour, and XC (e.g., 5 C, 10 C, 50 C etc.) denoting charging and/or discharging the cell in 1/X of an hour—with respect to a given capacity of the cell.

In certain embodiments, anode 108 may comprise conductive fibers 130B which may extend throughout anode 108 (illustrated, in a non-limiting manner, only at a section of anode 108) interconnect cores 110 and interconnected among themselves. Electronic conductivity may be enhanced by any of the following: binder and additives 102, coatings 130A, conductive fibers 130B, nanoparticles 112 and pre-coatings 120, which may be in contact with electronic conductive material (e.g., fibers) 130.

Lithium ion cell 100A comprises anode(s) 108 (in any of its configurations disclosed herein) made of anode material with composite anode material such as any of anode material particles 110, 110A, 110B, electrolyte 85 and at least cathode 87 delivering lithium ions during charging through cell separator 86 to anode 108. Lithium ions ($Li^+$) are lithiated (to $Li^{-01}$, indicating substantially non-charged lithium, in lithiation state) when penetrating the anode material, e.g., into anode active material cores 110 (possibly of core-shell particles 110B). Any of the configurations of composite anode material and core-shell particles 110B presented below may be used in anode 108, as particles 110B are illustrated in a generic, non-limiting way. In core-shell particle configurations 110B, the shell may be at least partly provided by coating(s) 120, and may be configured to provide a gap 140 for anode active material 110 to expand 101 upon lithiation. In some embodiments, gap 140 may be implemented by an elastic or plastic filling material and/or by the flexibility of coating(s) 120 which may extend as anode active material cores 110 expand and thereby effective provide room for expansion 101, indicated in FIG. 9A schematically, in a non-limiting manner as gap 140. Examples for both types of gaps 140 are provided below, and may be combined, e.g., by providing small gap 140 and enabling further place for expansion by the coating flexibility.

Examples for electrolyte 85 may comprise liquid electrolytes such as ethylene carbonate (EC), diethyl carbonate (DEC), propylene carbonate (PC), fluoroethylene carbonate (FEC), ethyl methyl carbonate (EMC), dimethyl carbonate (DMC), vinylene carbonate (VC), possibly tetrahydrofuran (THF) and/or its derivatives, and combinations thereof and/or solid electrolytes such as polymeric electrolytes such as polyethylene oxide, fluorine-containing polymers and copolymers (e.g., polytetrafluoroethylene), and combinations thereof. Electrolyte 85 may comprise lithium electrolyte salt(s) such as $LiPF_6$, $LiBF_4$, lithium bis(oxalato)borate, $LiN(CF_3SO_2)_2$, $LiN(C_2F_5SO_2)_2$, $LiAsF_6$, $LiC(CF_3SO_2)_3$, $LiClO_4$, LiTFSI, $LiB(C_2O_4)_2$, $LiBF_2(C_2O_4)$, tris(trimethylsilyl)phosphite (TMSP) and combinations thereof. Ionic liquid(s) may be added to electrolyte 85 as disclosed below.

Additive(s) (e.g., at few % wt) may comprise tris(trimethylsilyl)phosphite (TMSP), tris (trimethylsilyl) borate (TMSB), lithium difluoro(oxalato)borate (LiFOB), succinic anhydride, trimethyl phosphate (TMP) and triphenyl phosphate (TFP), fluorinated solvents (methyl nonafluorobutyl ether (MFE), and combinations thereof. Ionic liquid(s) may be added to electrolyte 85 as disclosed below.

In certain embodiments, cathode(s) 87 may comprise materials based on layered, spinel and/or olivine frameworks, and comprise various compositions, such as LCO formulations (based on $LiCoO_2$), NMC formulations (based on lithium nickel-manganese-cobalt), NCA formulations (based on lithium nickel cobalt aluminum oxides), LMO formulations (based on $LiMn_2O_4$), LMN formulations (based on lithium manganese-nickel oxides), LFP formulations (based on $LiFePO_4$), lithium rich cathodes, and/or combinations thereof. Separator(s) 86 may comprise various materials, such as polyethylene (PE), polypropylene (PP) or other appropriate materials. Possible compositions of anode(s) 100 are disclosed below in detail.

Examples for bonding molecules 180 may comprise e.g., lithium 3,5-dicarboxybenzenesulfonate, lithium sulfate, lithium phosphate, lithium phosphate monobasic, lithium trifluoromethanesulfonate, lithium 1,1,2,2,3,3,4,4,5,5,6,6,7,7,8,8,8-heptadecafluorooctane-1-sulfonate, lithium 2,6-dimethylbenzene-1,4-disulfonate, lithium 2,6-di-tert-butylbenzene-1,4-disulfonate, 3,3'-((1,2-dithiane-4,5-diyl)bis(oxy))bis(N-hydroxypropanamide), 3,3'-((4-mercapto-1,2-phenylene)bis(oxy))bis(N-hydroxypropanamide), lithium aniline sulfonate (the sulfonate may be in any of para, meta and ortho positions) as well as poly(lithium-4-styrenesulfonate), as well as related molecules derived therefrom by various substitutions and modifications, provided as some non-limiting examples.

In FIG. 9A, the different configurations are illustrated schematically in different regions of the anode surface, yet embodiments may comprise any combinations of these configurations as well as any extent of anode surface with any of the disclosed configurations. Anode(s) 108 may then be integrated in cells 100A which may be part of lithium ion batteries, together with corresponding cathode(s) 87, electrolyte 85 and separator 86, as well as other battery components (e.g., current collectors, electrolyte additives—see below, battery pouch, contacts, and so forth).

In certain embodiments, batteries 100A may be modified to comprise mechanical barriers configured to prevent full expansion of the anode material upon lithiation. For example, such mechanical barriers may be configured to enable 80% or less of the full expansion of the anode material upon lithiation. In certain embodiments, the anode material may comprise composite anode material particles 110B (see, e.g., FIGS. 9A, 9B) having shell structures which are smaller (provide a smaller expansion volume) than a full expansion volume of cores of the composite anode material particles. In certain embodiments, cathode(s) 87 of modified fast-charging lithium ion battery 100A may be designed to have a smaller capacity than anode(s) 108, as the cathodes are required to provide a smaller amount of lithium ions when battery 100A operates only within narrow operation range 105.

Figure 9B:
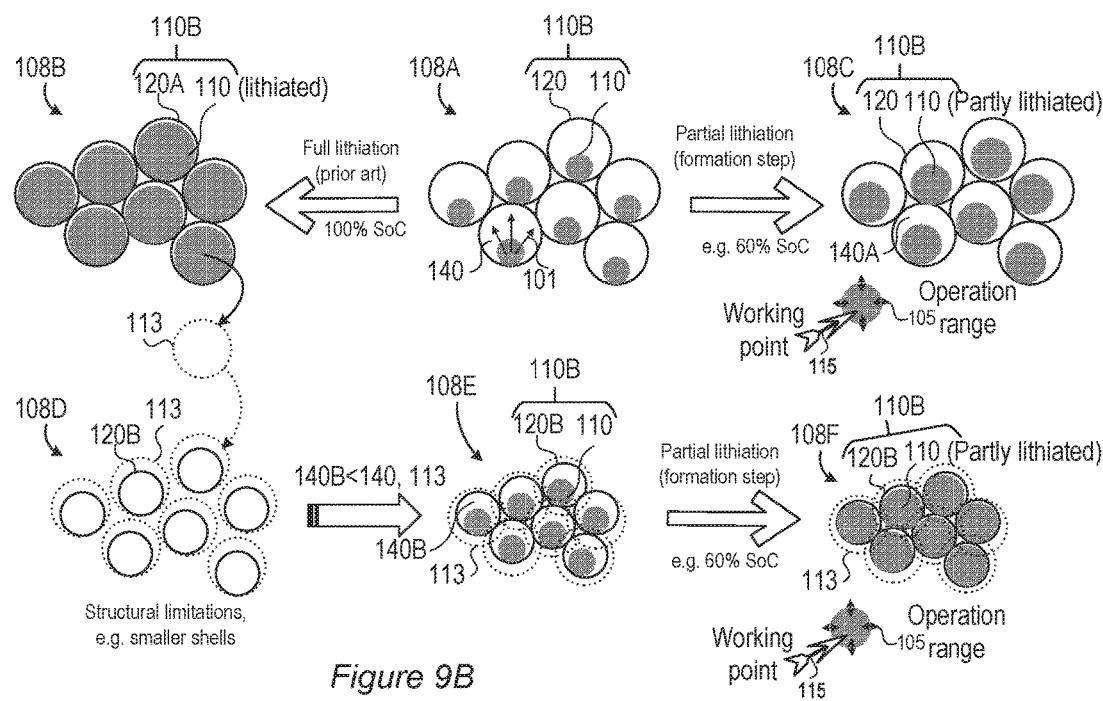
FIG. 9B is a high level schematic illustration of partial lithiation and mechanical barriers for lithiation of the anode material particles, according to some embodiments of the invention.

FIG. 9B is a high level schematic illustration of partial lithiation and mechanical barriers for lithiation of the anode material particles, according to some embodiments of the invention. Fast-charging lithium ion battery 100A may have e.g., Si, Ge, Sn and/or LTO-based anode active material and be designed to operate at 5 C at least and within operation range 105 of 5% at most around working point 115 of between 60-80% lithiation of the anode active material. FIG. 9B illustrates schematically a small section 108A of anode 108 with composite particles 110B, which are depicted in a noon-limiting manner as "yolk and shell" particles comprising anode material particles 110 as cores ("yolks") internally attached to coating(s) 120 ("shells") and having gap 140 for expansion 101 due to lithiation during formation and charging.

In prior art use of lithium ion batteries, illustrated schematically by small section 108B, anode material particles 110 are being fully lithiated during formation and charging in operation (e.g., 100% SoC, 95% or 99% SoC, certain voltage level or minimal voltage change indication full lithiation etc. as various used indicators of full charging). Shells 120A are correspondingly configured (e.g., in a formation process step) to provide gap 140 sufficient to accommodate the full expansion under lithiation of anode material particles 110.

In contrast, some embodiments may implement partial lithiation to obtain working point 115 illustrated schematically by small section 108C. For example, a formation process may be applied to configure composite particles 110B to have partly lithiated anode material particles 110 (e.g., with working point 115 being any of 20%, 40%, 60%, 80% or intermediate lithiation states, e.g., in terms of SoC). Operation of battery 100A may then be carried out only within operation range 105 around working point 115, e.g., ±1% SoC (alternatively, as disclosed herein, ±2%, ±0.5%, ±5%, ±0.1%, ±10% or intermediate operation ranges 105 as non-limiting examples). A remaining gap 140A may be configured to serve various purposes such as any of (i) enhancing ionic and/or electronic conductivity to cores 110 by an appropriate filling material, (ii) maintaining contact of cores 110 with shells 120 (e.g., by elastic filling material that is compressed during formation), (iii) supporting the mechanical stability of anode 108 and/or the contact among composite particles 110B and so forth.

Alternatively or complementarily, some or all composite particles 110B may be configured with smaller gaps 140B to form mechanical barriers (structural limitations) on the possible expansion 101 of cores 110. As illustrated schematically in section 108D, full lithiation of cores 110 may yield an expansion volume 113 (e.g., typically up to 300% in Si as anode material); shells 120B may be configured (e.g., as in a given structure and/or in a formation step designed for this purpose) to be smaller than maximum-lithiation expansion volume 113 (e.g., any of 20%, 40%, 60%, 80% thereof, or any intermediate value, in terms of volume). As illustrated schematically by small section 108E, composite particles 110B may comprise anode material particles 110 in shells 120B which have a smaller volume than shells 120, prohibiting full lithiation of cores 110. Accordingly, gaps 140B in non-lithiated state of cores 110 may be smaller than prior art gaps 140 designed to accommodate full lithiation.

Shells 120B may be configured according to working point 115 and operation range 105, to accommodate just the maximal partial lithiation to which anode 108 and battery 100A are designed, as illustrated schematically by small section 108F.

It is emphasized that gaps 140, 140A, 140B may be implemented by an elastic or plastic filling material in shells 120 and/or implemented by the flexibility of coating(s) 120 (coating 120 may be configured to extend as anode active material particles 110 expand, to provide room for expansion 101).

While contrary to prior art configuration, and counterintuitive in the sense that the potential capacity of the anode material is being severely limited already in the design of battery 100A, the inventors have found out that for the supercapacitor emulation applications disclosed herein, designs such as illustrated in section 108F with shells 120B smaller than maximum-lithiation expansion volume 113 of anode material particles 110 are advantageous in the sense that they enable more efficient use of space (by avoiding gaps 140A) and result in higher volumetric capacity and higher instantaneous current inputs and outputs which are important in supercapacitor emulating batteries 100A and devices 100, as disclosed herein.

FIGS. 10A-10C are high level schematic illustrations relating to the selection of working point 115 and narrow operation range 105, according to some embodiments of the invention. FIGS. 10A, 10B illustrate schematically charging and discharging graphs, respectively and FIG. 10C illustrates an example for an optimal working window for selecting working point 115, and illustrates an example for considerations for selecting working point 115.

As illustrated schematically in FIGS. 10A-10C, around working point 115 and narrow partial operation range 105 may be determined (230) at different locations on either of charging and discharging curves (FIGS. 10A and 10B, respectively) according to various considerations. Moreover, modified battery 100A may be re-configured with respect to the determined working point 115 and narrow partial operation range 105 to improve the performance of device 100 even further. In such case, modified battery 100A may no longer be capable of exhibiting full charging and discharging ranges as the unmodified lithium ion battery, yet still may be operated within narrow range 105 of its potential capacity. For example, anode material particles 110 may be made of Si which expands by up to 300% upon lithiation, yet modified battery 100A may be operated by control unit 106 only in narrow range 105 which results in a much narrower range of physical expansion upon lithiation, e.g., of 10% or 20%. As a result, modified battery 100A may be designed to provide less means for coping with expansion 101 of anode material particles 110 and as a consequence may be designed to have a larger volumetric capacity than a regular lithium ion battery configured to operate over the full charging and discharging range.

FIG. 10C illustrates an example for an optimal working window for selecting working point 115, and non-limiting selection considerations, according to some embodiments of the invention. The graph illustrates, in a non-limited manner, and example for the normalized anode DC (direct current) resistance performance as function of the state of charge (SoC) and provides the optimal working range for modified battery 100A as the SoC range with low resistance, in which working point 115 and operation range 105 may be selected (indicated schematically by sets of an ornate arrow indicating working point 115 and a double-headed arrow indicating the operation range 105).

FIG. 10C further illustrates schematically anode material particles having anode material cores 110 and coating 120 at two ends of the optimal working window, namely at lower and higher lithiation states at the left-hand and right-hand sides thereof (with $Li^{-01}$ indicating the higher lithiation state). Expansion 101 is indicated schematically, in an exaggerated manner, for narrow operation range 105 in each case. In the lower lithiation state (e.g., 20-30% lithiation) the volume change of anode material particle 110 with respect to the size of anode material particle 110 (its relative expansion) is larger than the volume change of anode material particle 110 with respect to the size of anode material particle 110 (its relative expansion) in the higher lithiation state (e.g., 70-80% lithiation), because anode material particle 110 themselves are larger due to the higher level of lithiation. This effect may be significant in metalloid-based anode material such as Si, Ge, Sn and/or LTO, which expand by 100-500% or more upon lithiation (e.g., Si 400%, Ge 270% and Sn 330%). In certain embodiments, working point 115 may be selected at a lithiated state of the anode material in which the anode material particles are expanded, so that the additional expansion due to further charging is relatively small. In certain embodiments, anode material lithiation at working point 115 may be e.g., 50-80%, such as at 50%, 60%, 70%, 80% lithiation or at similar values. The inventors have found out that as modified battery 100A is operated only over operation range 105, its design may be optimized for its specific operation specifications.

In certain embodiments, anode modifications 260 may comprise enhancing ionic and/or electronic transport kinetics and conductivity, e.g., by various elements disclosed in FIG. 9A such as ionic-conducting coatings and conductive additives. In addition to the amount of active material discussed above, also anode parameters such as thickness and porosity may be modified to increase the capacity and the conductivity (and thereby the C rate) and enhance the operation of modified battery 100A within operation range 105 around working point 115. In certain embodiments, cathode 87 and/or electrolyte 85 may also be modified to enhance operation of modified battery 100A within operation range 105 around working point 115.

In certain embodiments, as operation range 105 is restricted with respect to lithium ion batteries which are used over the whole operation range, battery 100A may be configured to have smaller cathode(s) 87, e.g., thinner cathode(s) 87, cathode(s) 87 with a smaller area, etc., having a smaller capacity than anode(s) 108. In certain embodiments, cathode(s) 87 may have a charge capacity which is smaller than the charge capacity of anode(s) 108 by e.g., 10%, 20%, 30% or even 40%. For example, cathode(s) 87 may have a capacity of 90%, 80%, 70%, 60%, respectively, of the capacity of anode(s) 108. These differences may be with respect to pristine cathodes and anodes, and/or with respect to cathodes and anodes in operation. It is noted that as some of the cathode lithium is absorbed in the SEI (solid electrolyte interphase) during the formation process, a required operational cathode-anode load ratio may be implemented as a larger cathode-anode load ratio of the pristine electrodes. As operation range 105 is set to be smaller, the cathode-anode load ratio may also be smaller, requiring smaller cathodes.

Advantageously, disclosed fast-charging battery 100A and/or devices 100 do not only emulate supercapacitors to provide comparable or better performance, but are also superior to equivalent supercapacitors in having lower self-discharge rates, higher working potentials, shorter charging times and higher energy densities than comparable supercapacitors.

For example, fast-charging battery 100A typically provide an average output voltage level above 3V (e.g., 3.35V averaged from 4.3V to 2V) while supercapacitors are typically specified at 2.7V output voltage or even less, which moreover decays with self-discharge of the supercapacitor. Fast-charging batteries 100A and/or devices 100 therefore provide a wider usable voltage range that broadens the operating margin for designers using them, with respect to using equivalent supercapacitors.

Moreover, operating fast-charging batteries 100A and/or devices 100 may be configured to provide a very stable output voltage which is beneficial in many product designs. Not only that fast-charging batteries 100A provide most of their energy capacity at a stable voltage level (e.g., 3.35V), but they regulated operation within narrow operation range 105 around working point 115 enhances the constancy of the output (and/or input) operation voltage significantly. The very stable output voltage delivered by disclosed fast-charging batteries 100A and/or devices 100 stands in stark contrast to equivalent supercapacitors which typically produce an output voltage that is linearly proportional to their charge (e.g., a supercapacitor fully charged to 3.3V delivers 3.3V at 100% charge but only 1.65V at 50% charge, which is below the level required by many processors and other devices.

It is also noted that the low levels of self-discharge of fast-charging batteries 100A and/or devices 100 with respect to equivalent supercapacitors is advantageous in avoiding the over-design of power sources in systems using supercapacitors, required to compensate for supercapacitors' high losses. For example, in certain embodiments, fast-charging batteries 100A and/or devices 100 may be configured to operate at a voltage level of at least 3V, and have a leakage current smaller than 0.1% of a respective maximal continuous current.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. An electric vehicle (EV) power train comprising:
    a main fast-charging lithium ion module (FC), configured to deliver power to the EV,
    a supercapacitor-emulating fast-charging lithium ion module (SCeFC), configured to receive power and to deliver power to the EV and/or to the FC,
    wherein both the FC and the SCeFC have anodes based on the same anode active material,
    wherein the SCeFC is configured to be operable at a maximal charging rate of at least 5 C and within an operation range of 5% at most around a working point of between 60-80% lithiation of the anode active material; and
    a control unit configured to:
    maintain a state of charge (SoC) of the SCeFC within the operation range around the working point, manage the FC and the SCeFC with respect to power delivery to and from the EV, respectively, and manage power delivery from the SCeFC to the FC and/or to the EV according to specified criteria.

2. The EV power train of claim 1, wherein the control unit is further configured to minimize a depth of discharge (DoD) of the FC.

3. The EV power train of claim 1, wherein the control unit is further configured to minimize a number of cycles of the FC.

4. The EV power train of claim 1, wherein the anode active material is Si, Ge and/or Sn-based.

5. The EV power train of claim 1, wherein the anode active material is LTO (lithium titanate)-based.

6. The EV power train of claim 1, wherein both modules, FC and SCeFC, are implemented in a single battery, wherein the control unit is further configured to manage allocation of elements of the single battery to the FC and the SCeFC.

7. The EV power train of claim 6, wherein the control unit is further configured to re-allocate elements of the single battery between the FC and the SCeFC according to operation parameters of the elements.

8. The EV power train of claim 1, wherein the FC and SCeFC are implemented in at least two corresponding separate batteries.

9. The EV power train of claim 1, wherein the control unit is further configured to allocate at least a part of the SCeFC to complement operation of the FC when the FC experiences reduced capacity, wherein the allocation is carried out by increasing the operation range of the SCeFC.

10. The EV power train of claim 1, wherein the anode active material is configured to enable operation of the SCeFC only around the working point and within the operation range.

11. The EV power train of claim 10, wherein an anode of the SCeFC comprises internal mechanical barriers configured to prevent full expansion of the anode material upon lithiation.

12. The EV power train of claim 11, wherein the mechanical barriers are configured to enable 80% or less of the full expansion of the anode material upon lithiation.

13. The EV power train of claim 1, wherein a cathode of the SCeFC has a capacity of 80% or less than the anode thereof.

14. The EV power train of claim 1, wherein the SCeFC is configured to be operable at a maximal charging rate of at least 50 C.

15. An EV comprising the EV power train of claim 1.

16. A method comprising:

configuring a power train for an electric vehicle (EV) from a main fast-charging lithium ion module (FC), configured to deliver power to the EV, and a supercapacitor-emulating fast-charging lithium ion module (SCeFC), configured to receive power and to deliver power to the EV and/or to the FC, wherein both the FC and the SCeFC have anodes based on the same anode active material, and wherein the SCeFC is configured to be operable at a maximal charging rate of at least 5 C and within an operation range of 5% at most around a working point of between 60-80% lithiation of the anode active material, operating the SCeFC battery to maintain a state of charge (SoC) of the SCeFC within the operation range around the working point, managing the FC and the SCeFC with respect to power delivery to and from the EV, respectively, and managing power delivery from the SCeFC to the FC and/or to the EV according to specified criteria.

17. The method of claim 16, further comprising allocating at least a part of the SCeFC to complement operation of the FC when the FC experiences reduced capacity, wherein the allocation is carried out by increasing the operation range of the SCeFC.

18. The method of claim 16, further comprising configuring the anode active material to enable operation of the SCeFC only around the working point and within the operation range.

19. The method of claim 16, further comprising selecting the working point within an optimal operation window of the SCeFC as a highly lithiated point to reduce relative expansion of anode material particles during operation.

* * * * *